(12) United States Patent
Ogura et al.

(10) Patent No.: US 7,915,617 B2
(45) Date of Patent: Mar. 29, 2011

(54) SEMICONDUCTOR DEVICE

(75) Inventors: Tsuneo Ogura, Kanagawa-ken (JP); Ichiro Omura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 602 days.

(21) Appl. No.: 11/478,623

(22) Filed: Jul. 3, 2006

(65) Prior Publication Data

US 2007/0007537 A1  Jan. 11, 2007

(30) Foreign Application Priority Data

Jul. 4, 2005  (JP) ................. 2005-195255

(51) Int. Cl.
*H01L 31/0312*  (2006.01)
(52) U.S. Cl. ............. 257/77; 257/76; 257/E21.041
(58) Field of Classification Search ......... 257/77, 257/288, 192, 330, 341, 401, E29.297; 438/268, 438/275, 981
See application file for complete search history.

(56) References Cited

U.S. PATENT DOCUMENTS

| | | | |
|---|---|---|---|
| 5,393,999 A * | 2/1995 | Malhi ............................ | 257/289 |
| 5,742,076 A | 4/1998 | Sridevan et al. | |
| 5,831,288 A * | 11/1998 | Singh et al. .................... | 257/77 |
| 5,962,893 A | 10/1999 | Omura et al. | |
| 5,976,936 A * | 11/1999 | Miyajima et al. ............. | 438/268 |
| 6,057,558 A * | 5/2000 | Yamamoto et al. ............ | 257/77 |
| 6,262,439 B1 * | 7/2001 | Takeuchi et al. ............... | 257/77 |
| 6,504,176 B2 * | 1/2003 | Yokogawa et al. ............. | 257/77 |
| 6,653,659 B2 * | 11/2003 | Ryu et al. ....................... | 257/77 |
| 6,750,508 B2 | 6/2004 | Omura et al. | |
| 7,049,194 B2 * | 5/2006 | Hshieh et al. ................. | 438/259 |
| 7,173,307 B2 * | 2/2007 | Hayashi et al. ............... | 257/330 |
| 2005/0263852 A1 | 12/2005 | Ogura et al. | |

(Continued)

FOREIGN PATENT DOCUMENTS

JP   2001-094097   4/2001

(Continued)

OTHER PUBLICATIONS

Shinsuke Harada, et al., "An Ultra-Low $R_{on}$ in 4H-SiC Vertical MOSFET: Buried Channel Double-Epitaxial Mosfet", Proceedings of the 16th International Symposium on Power Semiconductor Devices & ICs, May 24-27, 2004, pp. 313-316.

(Continued)

*Primary Examiner* — Leonardo Andújar
*Assistant Examiner* — William Harriston
(74) *Attorney, Agent, or Firm* — Oblon, Spivak, McClelland, Maier & Neustadt, L.L.P.

(57) ABSTRACT

A semiconductor device comprises: a first semiconductor layer of silicon carbide of a first conductivity type; a second semiconductor layer of silicon carbide of a second conductivity type selectively provided on the first semiconductor layer; a main electrode layer of silicon carbide of the first conductivity type selectively provided on the second semiconductor layer; a gate insulating film provided on the second semiconductor layer; a gate electrode formed on the gate insulating film; and a third semiconductor layer of the first conductivity type intervening a current path which is formed between the main electrode layer and the first semiconductor layer when an ON voltage is applied to the gate electrode. The third semiconductor layer is selectively provided on the first semiconductor layer and is adjacent to the second semiconductor layer. A doping density of the third semiconductor layer is higher than a doping density of the first semiconductor layer.

20 Claims, 25 Drawing Sheets

U.S. PATENT DOCUMENTS

| | | | |
|---|---|---|---|
| 2006/0223260 A1* | 10/2006 | Henson | 438/243 |
| 2007/0013021 A1* | 1/2007 | Zhang | 257/500 |
| 2007/0281462 A1* | 12/2007 | Kawada | 438/622 |
| 2008/0012043 A1* | 1/2008 | Udrea et al. | 257/163 |
| 2008/0050876 A1* | 2/2008 | Matocha et al. | 438/269 |
| 2008/0128711 A1* | 6/2008 | Okuno et al. | 257/77 |
| 2008/0265260 A1* | 10/2008 | Kitabatake et al. | 257/77 |

FOREIGN PATENT DOCUMENTS

| | | |
|---|---|---|
| JP | 2001-119025 | 4/2001 |
| JP | 2003-318409 | 11/2003 |

OTHER PUBLICATIONS

Yoshitaka Sugawara, et al., "1.4kV 4H-SiC UMOSFET with Low Specific On-Resistance", Proceedings of 1998 International Symposium on Power Semiconductor Devices & ICs, Kyoto, 1998, pp. 119-122.

* cited by examiner

SEMICONDUCTOR DEVICE

CROSS-REFERENCE TO RELATED APPLICATIONS

This application is based upon and claims the benefit of priority from the prior Japanese Patent Application No. 2005-195255, filed on Jul. 4, 2005; the entire contents of which are incorporated herein by reference.

BACKGROUND OF THE INVENTION

1. Field of the Invention

This invention relates to a semiconductor device, and more particularly to a semiconductor device based on silicon carbide.

2. Background Art

MOS semiconductor devices based on silicon materials are widely used for power switching and high-frequency switching applications. Such semiconductor devices for switching applications particularly require a high insulation breakdown voltage, low on-resistance, and fast switching rate. As compared with silicon, silicon carbide (SiC) has about ten times higher breakdown electric field and about three times higher thermal conductivity. For this reason, silicon carbide has the great potential as a material for fast and low-loss switching elements operable in high-temperature environments.

Furthermore, in silicon carbide, a silicon dioxide ($SiO_2$) gate oxide film can be formed by thermal oxidation. Therefore silicon carbide is suitable for MOS semiconductor devices as with silicon (e.g., "1.4 kV 4H-SIC UMOSFET with Low Specific On-Resistance", Proc. of 1998 ISPSD, pp. 119-122, 1998). There is a technical disclosure of a MOSFET having a trench configuration with reduced on-resistance (JP 2003-318409A).

In a MOSFET based on silicon carbide, a phenomenon is observed in which the electron mobility in the inversion layer formed at the gate oxide film interface of the base layer is lower than in the case of silicon. For example, the electron mobility is about 500 $cm^2$/V·sec in silicon, but about 10 to 50 $cm^2$/V·sec in silicon carbide. It is believed that this is attributed to trapping at the oxide film interface on the silicon carbide surface. In JP 2003-318409A mentioned above, an $n^-$-type layer is provided between the gate oxide film and the p-type base layer to accumulate electrons, thereby improving the electron mobility.

In such a structure, a low on-resistance can be achieved, but the gate threshold voltage is as low as 1 to 2 volts, which is unsuitable for power semiconductor devices. That is, an extremely low gate threshold voltage undesirably causes the MOSFET to malfunction due to noise applied to the gate electrode.

SUMMARY OF THE INVENTION

According to an aspect of the invention, there is provided a semiconductor device comprising: a first semiconductor layer of silicon carbide of a first conductivity type; a second semiconductor layer of silicon carbide of a second conductivity type selectively provided on the first semiconductor layer; a main electrode layer of silicon carbide of the first conductivity type selectively provided on the second semiconductor layer; a gate insulating film provided on the second semiconductor layer; a gate electrode formed on the gate insulating film; and a third semiconductor layer of the first conductivity type intervening a current path which is formed between the main electrode layer and the first semiconductor layer when an ON voltage is applied to the gate electrode, the third semiconductor layer being selectively provided on the first semiconductor layer and being adjacent to the second semiconductor layer, and a doping density of the third semiconductor layer being higher than a doping density of the first semiconductor layer.

According to other aspect of the invention, there is provided a semiconductor device comprising: a first semiconductor layer of silicon carbide of a first conductivity type; a second semiconductor layer of silicon carbide of a second conductivity type selectively provided on the first semiconductor layer; a main electrode layer of silicon carbide of the first conductivity type selectively provided on the second semiconductor layer; a gate insulating film; a gate electrode adjoining the gate insulating film; and a third semiconductor layer of the first conductivity type provided between the second semiconductor layer and the gate insulating film, the third semiconductor layer intervening a current path which is formed between the main electrode layer and the first semiconductor layer when an ON voltage is applied to the gate electrode, the third semiconductor layer is an accumulation channel layer of silicon carbide of the first conductivity type having a lower concentration than the main electrode layer, and the current path includes the accumulation channel layer and an inversion channel layer, the inversion channel layer being formed in a semiconductor of the second conductivity type when the ON voltage is applied to the gate electrode.

According to other aspect of the invention, there is provided a semiconductor device comprising: a first semiconductor layer of silicon carbide of a first conductivity type; a main electrode layer of silicon carbide of the first conductivity type provided on the first semiconductor layer; a main electrode provided on the main electrode layer; a trench penetrating the main electrode layer and extending in the first semiconductor layer; a gate insulating film provided on an inner wall surface of the trench; a gate electrode surrounded by the gate insulating film and packed inside the trench; an accumulation channel layer of silicon carbide of the first conductivity type provided between the gate insulating film and the first semiconductor layer and having a lower concentration than the main electrode layer; and a fourth semiconductor layer of a second conductivity type provided in the first semiconductor layer, the fourth semiconductor layer being spaced apart from and opposed to the accumulation channel layer, and the fourth semiconductor layer being electrically connected with the main electrode.

DETAILED DESCRIPTION OF THE INVENTION

The embodiment of the invention will now be described with reference to the drawings.

Figure 1:
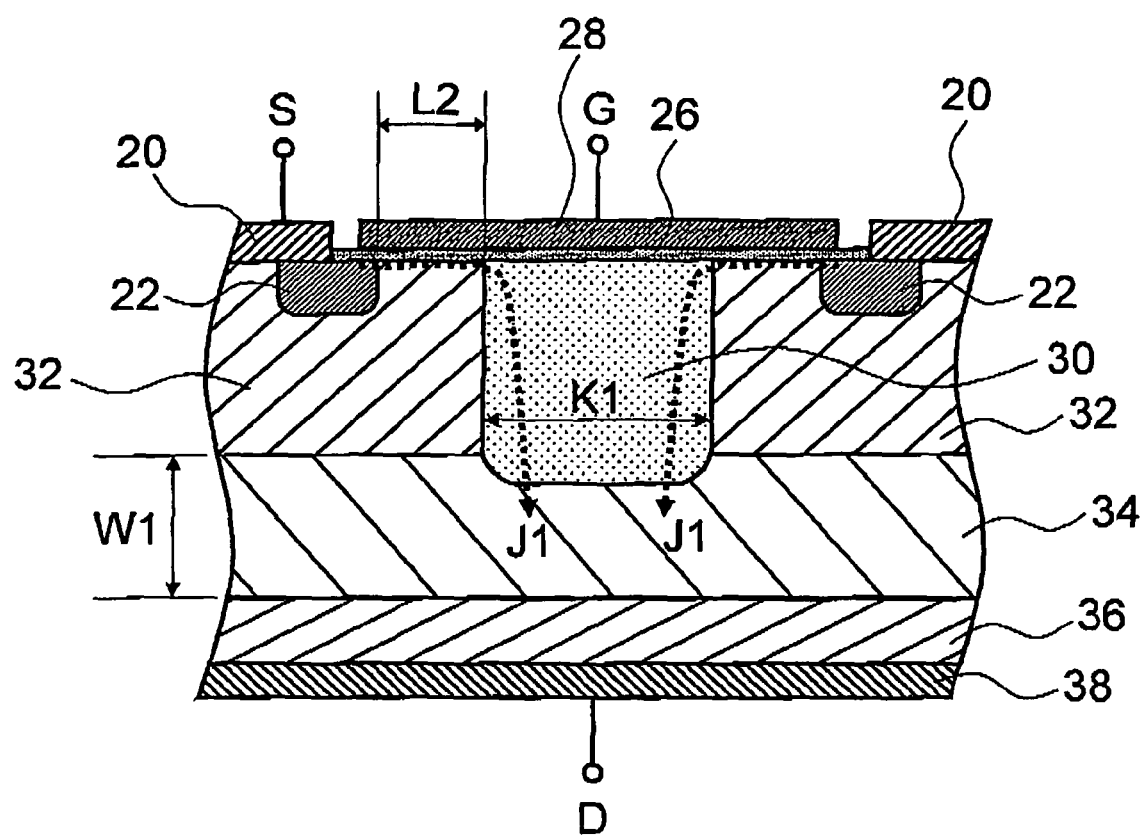
FIG. 1 is a schematic cross section of a semiconductor device according to a first example of the invention.

FIG. 1 is a schematic cross section of a semiconductor device according to a first example of the invention. More specifically, this figure shows a schematic cross-sectional structure of a planar MOSFET.

On an $n^+$-type drain layer (substrate) 36 of silicon carbide (SIC) are formed an $n^-$-type drift layer 34 and a p-type body layer 32, each made of silicon carbide. Here, when the device is illustratively designed to have a breakdown voltage of 1200 volts, the thickness W1 of the $n^-$-type drift layer 34 is about 10 micrometers, and the thickness of the p-type body layer 32 is about 1 micrometer. An $n^+$-type source layer (main electrode layer) 22 of the MOSFET is provided partially on top of the p-type body layer 32. An n-type layer 30 constituting the current path to the drain provided on the $n^+$-type drain layer (substrate) 36 side is provided so as to be connected to the $n^-$-type drift layer 34. These layers can be made of silicon carbide.

The width K1 of the n-type layer 30 can illustratively be 1 to 10 micrometers. In this example, the $n^-$-type drift layer 34 can be provided with a smaller thickness W1 and a higher concentration because the silicon carbide material is used, which has about ten times higher avalanche breakdown electric field than silicon. As a result, the on-resistance can be sufficiently decreased to about $1/100$ of that of silicon-based MOSFETs. The impurity concentration can illustratively be $1\times10^{19}/cm^3$ in the $n^+$-type drain layer (substrate) 36, $1\times10^{17}$ to $5\times10^{17}/cm^3$ in the p-type body layer 32, and $1\times10^{18}$ to $10\times10^{18}/cm^3$ in the $n^+$-type source layer 22. In the $n^-$-type drift layer 34, the concentration must be appropriately specified depending on the breakdown voltage.

The on-resistance of the device can be reduced by setting the Impurity concentration of the n-type layer 30 higher than the impurity concentration of the $n^-$-type drift layer 34. The breakdown voltage of the device can be kept high as the n-type layer 30 and the p-type body layer 34 are depleted at the same time when a voltage is applied to the device. The p-type body layer 32 and the n-type layer 30 are covered thereon with a gate oxide film 26, on which is provided a gate electrode 28 illustratively made of n-type polysilicon. While the n-type layer 30 is covered thereon with the gate oxide film 26 in FIG. 1, there is no need to form a channel because it is n-type, and this configuration is only for ease of processing. Removing the gate oxide film 26 on the n-type layer 30 complicates the process to some extent, but has an advantage of reducing the gate-drain capacitance and achieving speedup.

When a threshold or higher voltage is applied to the gate electrode 28, a channel region is formed in the p-type body layer 32, and electrons flow as shown by the dashed line J1 in FIG. 1. More specifically, in the ON state, electrons flow to the n-type layer 30 via the channel region formed in the vicinity of the surface of the p-type body layer 32.

In a silicon-based n-channel MOSFET, the gate oxide film forms an interface with the p-type silicon layer. When a positive voltage is applied to the gate, an inversion layer occurs at the interface and forms an n-channel.

Likewise, in the case of silicon carbide, as with silicon, a gate oxide film can be formed by thermal oxidation, for example. However, when the p-type body layer is formed by impurity diffusion as in the case of conventional silicon materials, the electron mobility in the inversion layer formed at the interface between the p-type body layer 32 and the oxide film is lower than in the case of silicon. For example, as described above, the electron mobility is about 500 $cm^2/V \cdot sec$ in silicon, but about 10 to 50 $cm^2/V \cdot sec$ in silicon carbide formed by impurity diffusion. It is believed that this is attributed to trapping and crystal defects at the oxide film interface of silicon carbide formed by impurity diffusion. This has limited the reduction of on-resistance.

For the purpose of reducing such effects of the interface, it is advantageous to form the p-type body layer 32 by epitaxial growth, for example. In this structure, the p-type body layer 32 is formed throughout the surface of the $n^-$-type drift layer 34 by epitaxial growth, and subsequently the n-type layer 30 can be formed by diffusion from the surface, for example. Thus the p-type body layer 32, the surface of which is to serve as a channel layer, can be formed by epitaxial growth, and hence the on-resistance can advantageously be reduced as compared with the case of the p-type body layer formed by impurity diffusion.

Furthermore, because the planar structure is used in this example, electric field concentration at the gate end face can be reduced, and thus a higher insulation breakdown voltage can be achieved. Moreover, the on-resistance can be further reduced by using the carbon (C) surface of the SiC crystal as a surface on the MOS interface side.

Next, a second example of the invention is described.

Figure 2:
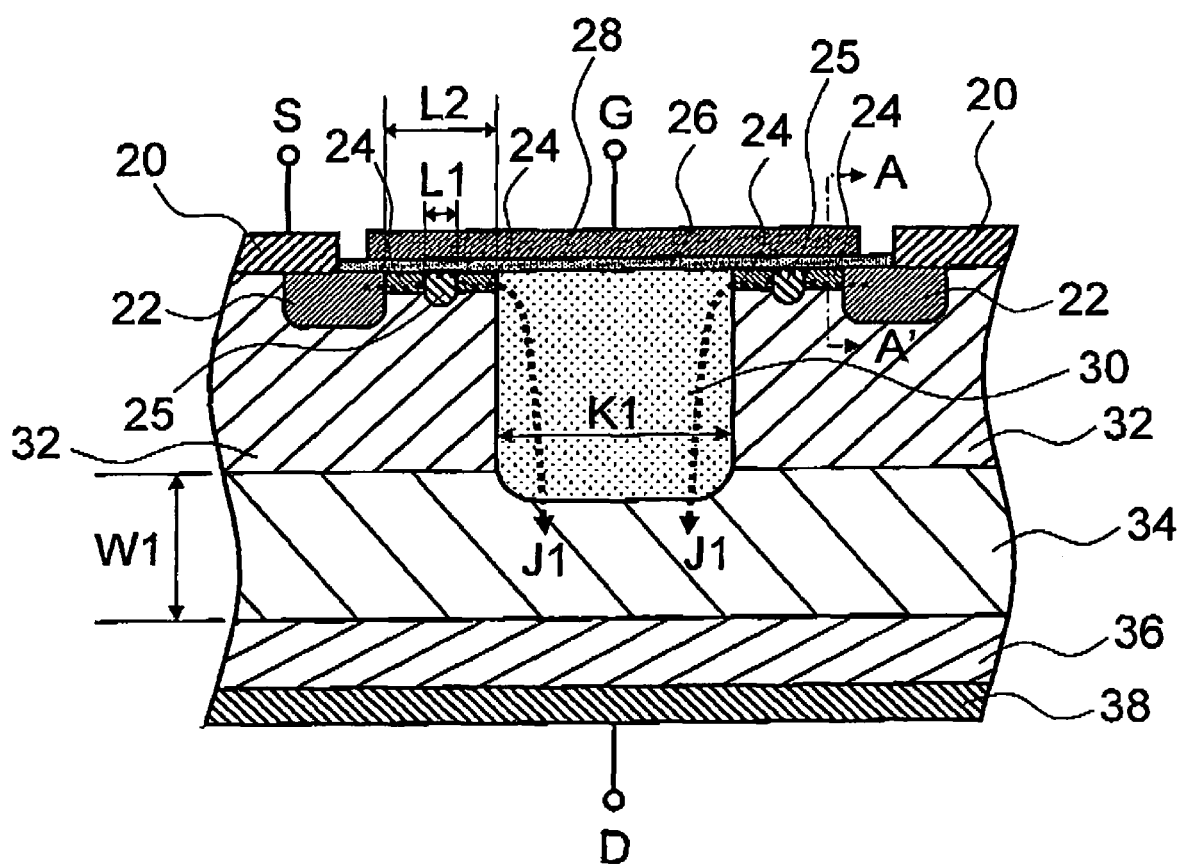
FIG. 2 is a schematic cross section of a semiconductor device according to a second example of the invention.

FIG. 2 is a schematic cross section of a semiconductor device according to a second example of the invention. More specifically, this figure shows a schematic cross-sectional structure of a planar MOSFET.

In this example again, on an $n^+$-type drain layer (substrate) 36 of silicon carbide (SiC) are formed an $n^-$-type drift layer 34 and a p-type body layer 32, each made of silicon carbide.

Here, when the device is illustratively designed to have a breakdown voltage of 1200 volts, the thickness W1 of the n⁻-type drift layer 34 is about 10 micrometers, and the thickness of the p-type body layer 32 is about 1 micrometer. An n⁺-type source layer (main electrode layer) 22 of the MOSFET is provided partially on top of the p-type body layer 32. An n-type layer 30 constituting the current path to the drain provided on the n⁺-type drain layer (substrate) 36 side is provided so as to be connected to the n⁻-type drift layer 34. These layers can be made of silicon carbide. Here, the n⁻-type drift layer 34 and the p-type body layer 32 can be formed by epitaxial growth to improve crystallinity and reduce leakage current.

As with the first example, the width K1 of the n-type layer 30 can illustratively be 1 to 10 micrometers. In this example again, the n⁻-type drift layer 34 can be provided with a smaller thickness W1 and a higher concentration because the silicon carbide material is used, which has about ten times higher avalanche breakdown electric field than silicon. As a result, the on-resistance can be sufficiently decreased to about 1/100 of that of silicon-based MOSFETs. The impurity concentration can illustratively be $1\times10^{19}/cm^3$ in the n⁺-type drain layer (substrate) 36, $1\times10^{17}$ to $5\times10^{17}/cm^3$ in the p-type body layer 32, $1\times10^{18}$ to $10\times10^{18}/cm^3$ in the n⁺-type source layer 22, and $1\times10^{16}$ to $10\times10^{16}/cm^3$ in the n-type accumulation channel layer 24. In the n⁻-type drift layer 34, the concentration must be appropriately specified depending on the breakdown voltage.

Figure 3:
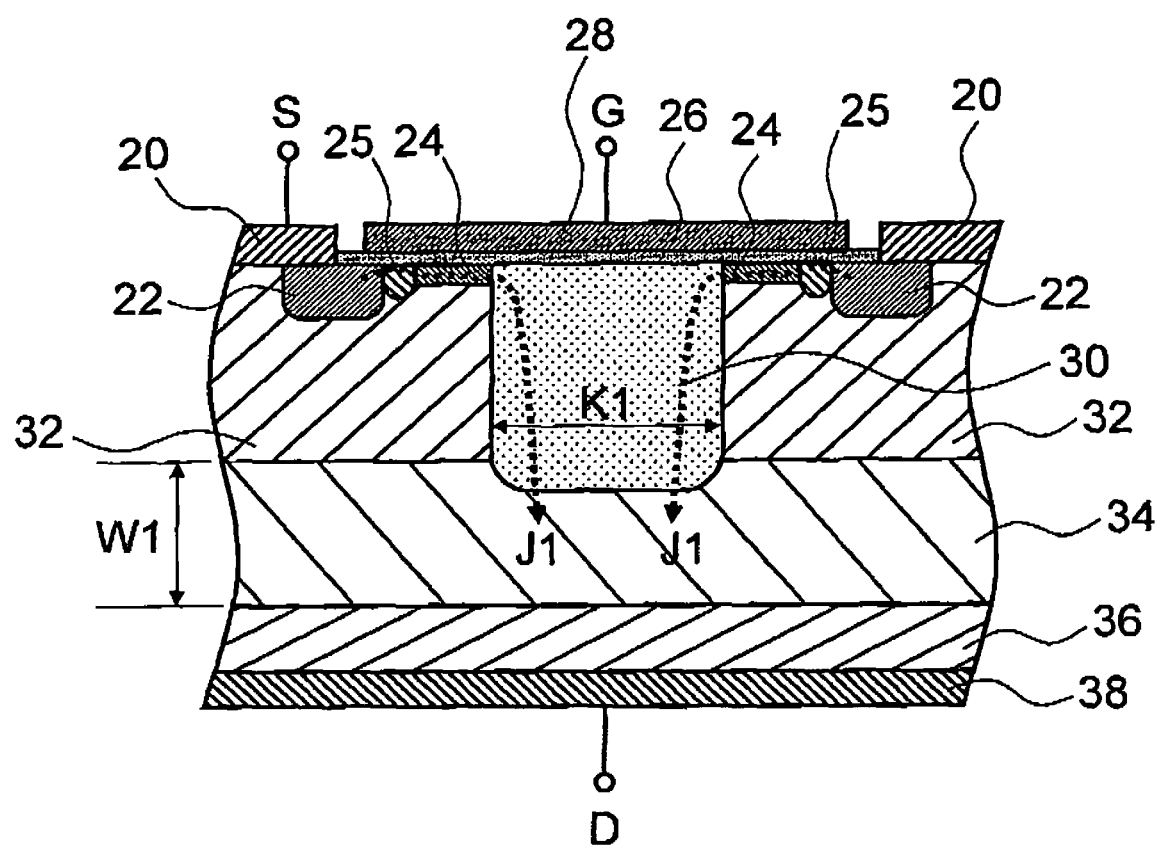
FIGS. 3 and 4 are schematic cross sections of a semiconductor device according to a variation of the second example of the invention.
Figure 4:
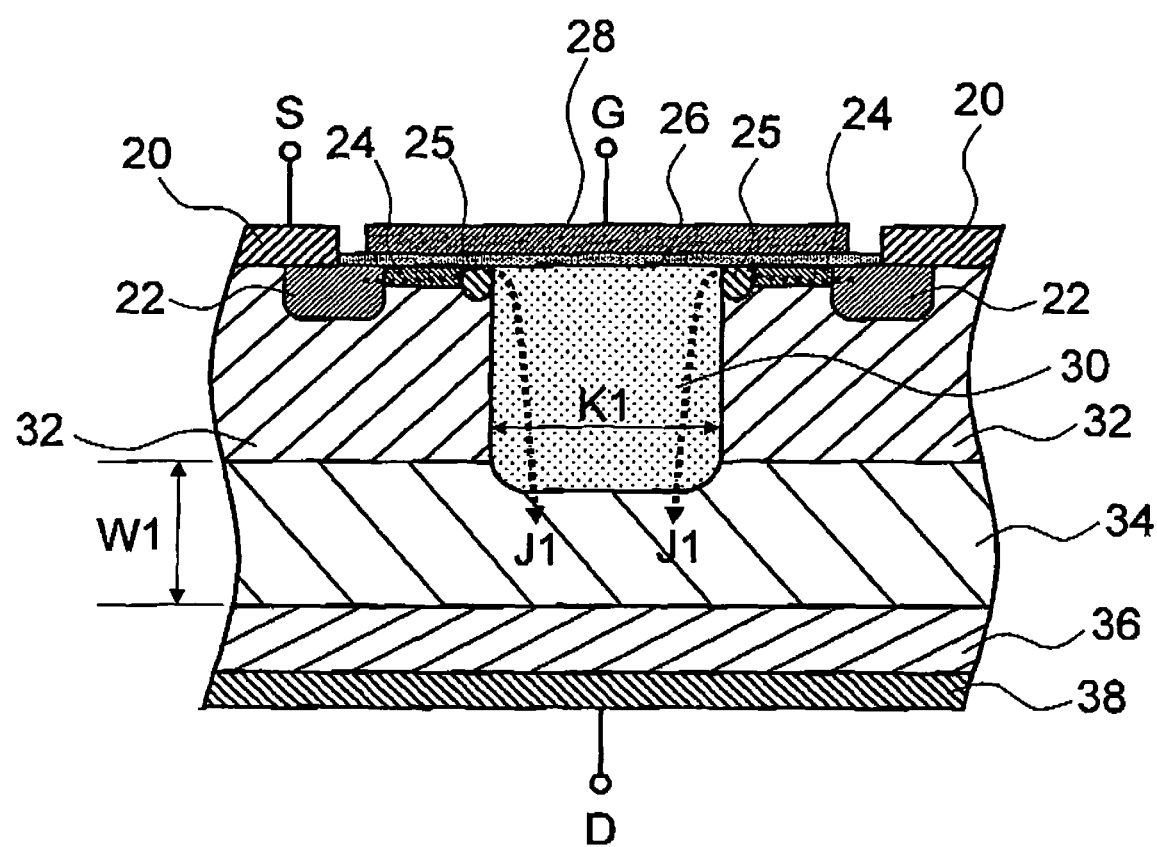

This example has an n-type accumulation channel layer 24 and a p-type layer 25 at the interface with the gate oxide film 26 between the n⁺-type source layer 22 and the n-type layer 30. Preferably, the length L1 of the p-type layer 25 along the channel is smaller than the length (L2−L1) of the n-type accumulation channel layer 24 along the channel, and is illustratively 1 micrometer or less to prevent the Increase of on-resistance. Its position can be appropriately selected between the n⁺-type source region 22 and the n-type layer 30. More specifically, FIG. 2 shows an example having a p-type layer 25 near the center between the n⁺-type source region 22 and the n-type layer 30. However, for example, the p-type layer 25 may be provided adjacent to the n⁺-type source region 22 as illustrated in FIG. 3, or adjacent to the n-type layer 30 as illustrated in FIG. 4.

The n-type accumulation channel layer 24, the p-type layer 25, and the n-type layer 30 are covered thereon with a gate oxide film 26, on which is provided a gate electrode 28 illustratively made of p-type polysilicon. While the n-type layer 30 is covered thereon with the gate oxide film 26 in FIG. 2, there is no need to form a channel because it is n-type, and this configuration is only for ease of processing. Removing the gate oxide film 26 on the n-type layer 30 complicates the process to some extent, but has an advantage of reducing the gate-drain capacitance and achieving speedup.

When a threshold or higher voltage is applied to the gate electrode 28, a channel region is formed as described later in detail, and electrons flow as shown by the dashed line J1 in FIG. 2. More specifically, in the ON state, electrons flow from the n⁺-type source layer 22 to the n-type layer 30 via the n-type accumulation channel layer 24, the interface between the p-type layer 25 and the oxide film, and the n-type accumulation channel layer 24.

In this example again, for the same reason as that described above with reference to the first example, the n-type accumulation channel layer 24 can be formed by epitaxial growth to reduce trapping at the oxide film interface of silicon carbide and significantly decrease the on-resistance.

Figure 5:
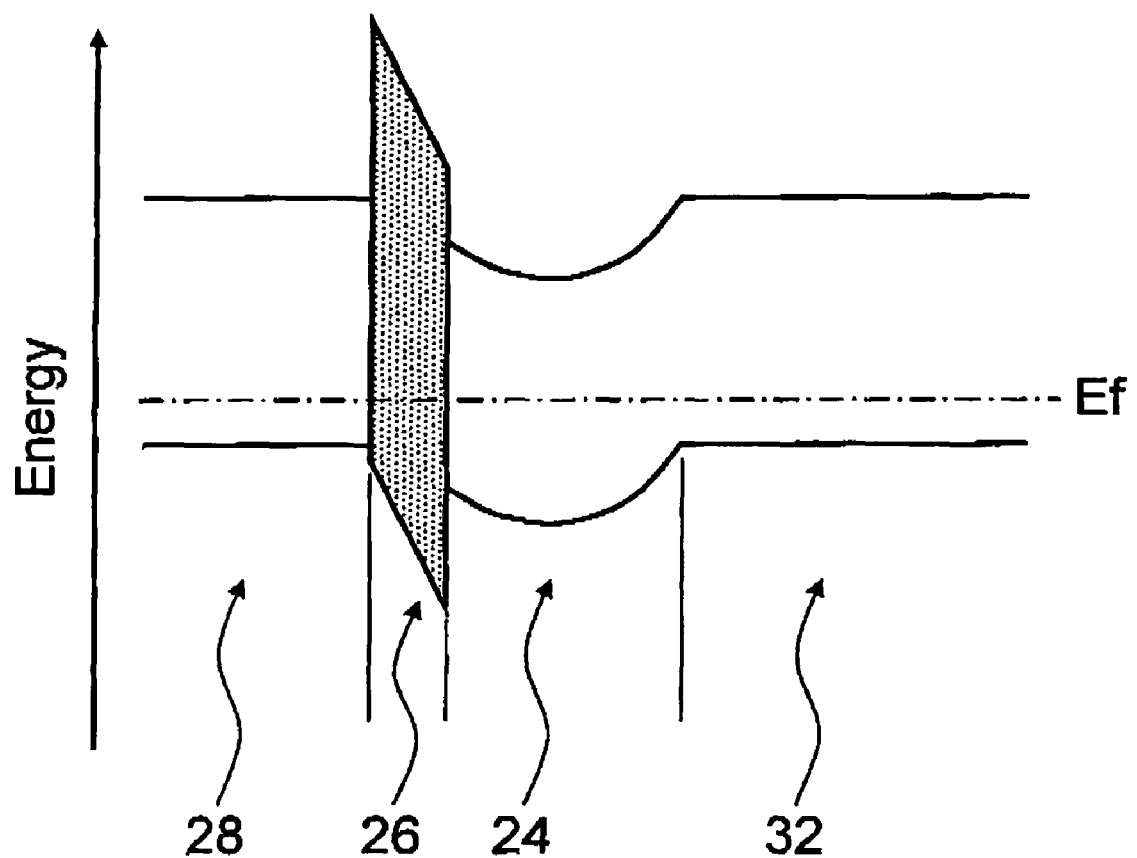
FIG. 5 is a schematic diagram illustrating a band structure along the dashed line A-A' in FIG. 2 for zero gate voltage.

FIG. 5 is a schematic diagram illustrating a band structure along the dashed line A-A' in FIG. 2 for zero gate voltage.

The Fermi level Ef of the n-type accumulation channel layer 24 is lowered and depleted by the Fermi level of the polysilicon gate electrode 28 and the p-type body layer 32. The n-type accumulation channel layer 24 has an impurity concentration such that the device is normally off, and can be depleted even when no negative gate voltage is applied. In the electrical conduction in this case, the channel depth is larger than in the above-mentioned inversion layer because application of a gate voltage causes a channel to be formed in the n-type accumulation channel layer 24. Therefore the effect of the interface on electrical conduction can be reduced, and the electron mobility can be improved.

Improvement of the electron mobility through this n-type accumulation channel layer 24 allows the on-resistance to be reduced. However, if the interface with the gate oxide film between the n⁺-type source layer 22 and the n-type layer 30 is entirely covered with the n-type accumulation channel layer 24, the gate threshold voltage Vth is decreased to 1 to 2 volts. This is because the n-type accumulation channel layer is absolutely n-type in contrast to the p-type inversion layer Silicon carbide MOSFETs will be widely used in power switching applications, which are often operated in environments where much electrical noise is generated. For this reason, in order to prevent malfunctions due to noise, the gate threshold voltage is desirably 5 volts or more. As an actual driving condition, a gate voltage of about 15 volts is more practical.

In this respect, in this example, the n-type accumulation channel layer 24 is selectively provided opposite to the gate oxide film 26 in order to achieve a gate threshold voltage of 5 volts or more, which is preferable for power applications. More specifically, there is a region where a p-type layer 25 is formed opposite to the oxide film 26 without providing the n-type accumulation channel layer 24. In this region, an inversion layer channel region is formed, and thus the gate threshold voltage can be higher than in the accumulation channel layer 24.

In the ON state, as shown by the dashed line 11, electrons are injected from the n⁺-type source layer 22, pass through the n-type accumulation channel layer 24 and the inversion layer channel region, and flow via the n-type layer 30 to the drain electrode 38. Here, the insulation breakdown voltage does not depend on the channel region, but can be independently determined by the layer thickness and concentration of the n⁻-type drift layer 34 and the p-type body layer 32. In an aspect of this example, the entire channel can be made normally off if the impurity concentration of the channel is specified so that at least the inversion layer channel region in the p-type layer 25 is made normally off.

In this example again, because of the planar structure, electric field concentration at the gate end face can be reduced, and a higher insulation breakdown voltage can be achieved. Furthermore, a low on-resistance can be achieved by providing the n-type accumulation channel layer 24. Moreover, the gate threshold voltage can be increased to 5 volts or more by providing the p-type layer 25. Thus, malfunctions due to noise can be prevented, and a MOSFET semiconductor device with higher reliability can be achieved.

Figure 6:
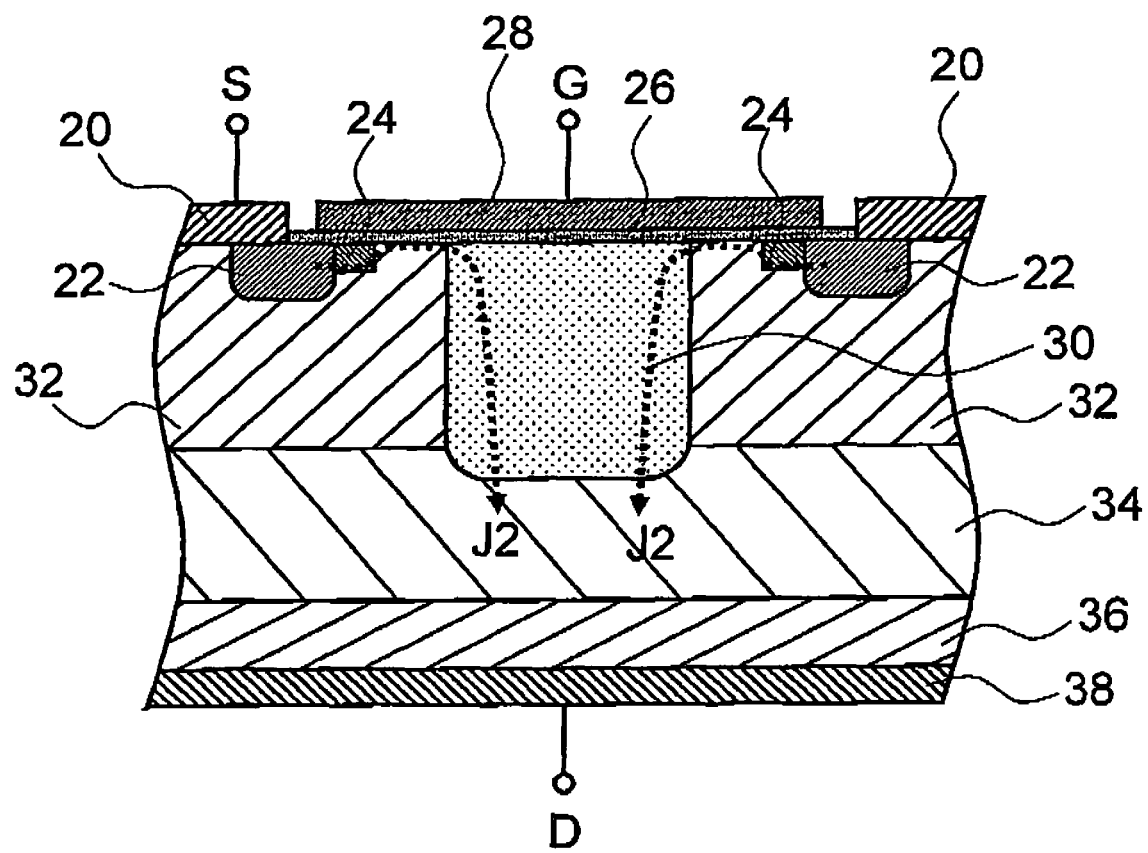
FIG. 6 is a schematic cross section of a semiconductor device configured as a planar MOSFET according to a third example of the invention.

FIG. 6 is a schematic cross section of a semiconductor device configured as a planar MOSFET according to a third example of the invention. With regard to this figure, elements similar to those described above with reference to FIGS. 1 to 5 are marked with the same reference numerals and not described in detail.

In this example, between the n+-type source layer 22 and the n-type layer 30, an n-type accumulation channel layer 24 is selectively provided opposite to the gate oxide film 26.

Furthermore, the p-type layer 25 in the second example is not provided. The region where the p-type body layer 32 is opposed to the gate oxide film 26 functions similarly to the p-type layer 25. The p-type body layer 32 forms an inversion layer channel region at its interface with the gate oxide film 26. This allows the gate threshold voltage as a whole to be sufficiently high even if the gate threshold voltage in the n-type accumulation channel layer 24 is lower than the gate threshold voltage in the inversion layer channel region. The electron flow J2 flows to the drain electrode 38 through the vicinity of the interface with the p-type body layer 32 in the n-type accumulation channel layer 24 and through the inversion layer channel region formed in the p-type body layer 32 opposite to the gate insulating film 26.

As a result, the third example can also achieve a MOSFET semiconductor device having a low on-resistance, a higher insulation breakdown voltage, and a stable operability against noise. In this example again, as described above with reference to the second example, the n-type accumulation channel layer 24 can be provided at an arbitrary position between the source layer 22 and the n-type layer 30. That is, the n-type accumulation channel layer 24 may be provided near the center between the source layer 22 and the n-type layer 30, or adjacent to the n-type layer 30.

As compared with the planar MOSFET according to the first example, the planar MOSFET according to the third example has an n-type accumulation channel layer 24 formed partially on the surface of the p-type body layer 32, and has an advantage of being less susceptible to the effect of interface mobility. Furthermore, as compared with the planar MOSFET according to the second example, the planar MOSFET according to the third example does not need the p-type layer 25, and has another advantage of simplifying the process.

Figure 7:
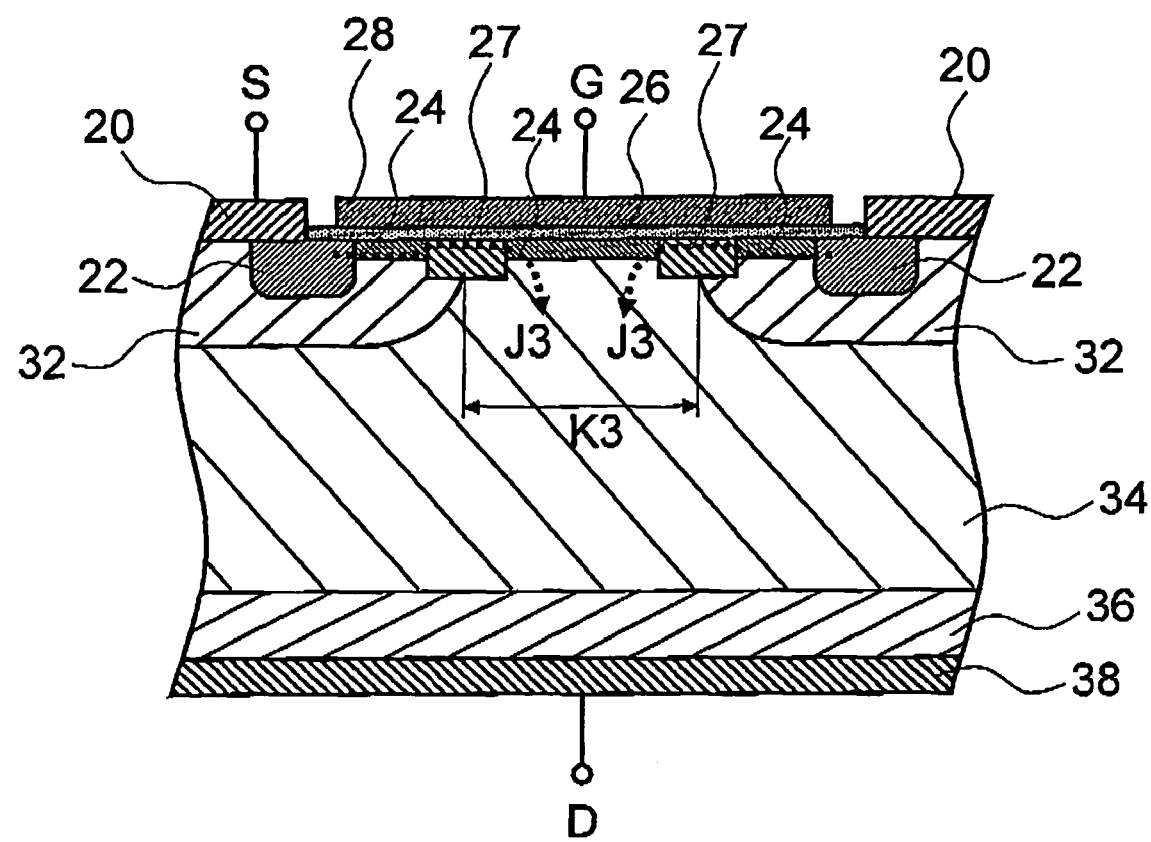
FIG. 7 is a schematic cross section of a semiconductor device configured as a planar MOSFET according to a fourth example of the invention.

FIG. 7 is a schematic cross section of a semiconductor device configured as a planar MOSFET according to a fourth example of the invention. With regard to this figure again, elements similar to those described above with reference to FIGS. 1 to 6 are marked with the same reference numerals and not described in detail.

In this example, the p-type body layer 32 is selectively formed on the surface of the n⁻-type drift layer 34. The n+-type source layer 22 is selectively formed on the surface of the p-type body layer 32. Above the region extending from the n+-type source layer 22 through the p-type body layer 32 to the n⁻-type drift layer 34 is provided a gate electrode 28 via the gate insulating film 26. An n-type accumulation channel layer 24 is formed on the surface of the semiconductor layer so as to be opposed to the gate electrode 28. Furthermore, a p-type layer 27 is provided on the surface of the p-type body layer 32 halfway on the electron conduction path formed by the channel layer 24.

Here, the end-to-end spacing K3 between the p-type body layers 32 can illustratively be 1 to 10 micrometers.

The electron flow 33 flows from the n+-type source layer 22 into the drain electrode 38 via the n-type accumulation channel layer 24, the inversion layer channel region formed in the p-type layer 27, and the n⁻-type drift layer 34. In this case again, the threshold can be increased to a desirable range by providing the p-type layer 27 on the path of electron flow. Thus a planar MOSFET semiconductor device can be achieved which has a low on-resistance, a high insulation breakdown voltage, and decreased malfunctions due to noise. That is, as compared with the planar MOSFET according to the first example, the planar MOSFET according to the fourth example is less susceptible to the effect of interface mobility because of the n-type accumulation channel layer 24, and can also increase the threshold and to further improve the Insulation breakdown voltage and noise resistance because of the p-type layer 27.

Note that in this example again, the position of the p-type layer 27 is not limited to the end of the p-type body layer 32. Besides, the p-type layer 27 may illustratively be provided adjacent to the source layer 22.

The method of forming a planar MOSFET according to the first to third examples may illustratively includes epitaxially forming the p-type body layer 32 on the upper surface of the n⁻-type drift layer 34 and subsequently forming the n-type layer 30. The planar MOSFET according to the first to third examples is advantageous in that an epitaxial layer having good crystallinity can be used for the p-type body layer 32. In an aspect of the planar MOSFET according to the fourth example, the p-type body layer 32 is formed by Ion implantation and diffusion, which improves the controllability of concentration. In another aspect, even when the p-type body layer 32 is formed by diffusion, the n-type accumulation channel layer 24 formed in the major portion of the Interface makes the structure less susceptible to crystal defects due to diffusion.

Figure 8:
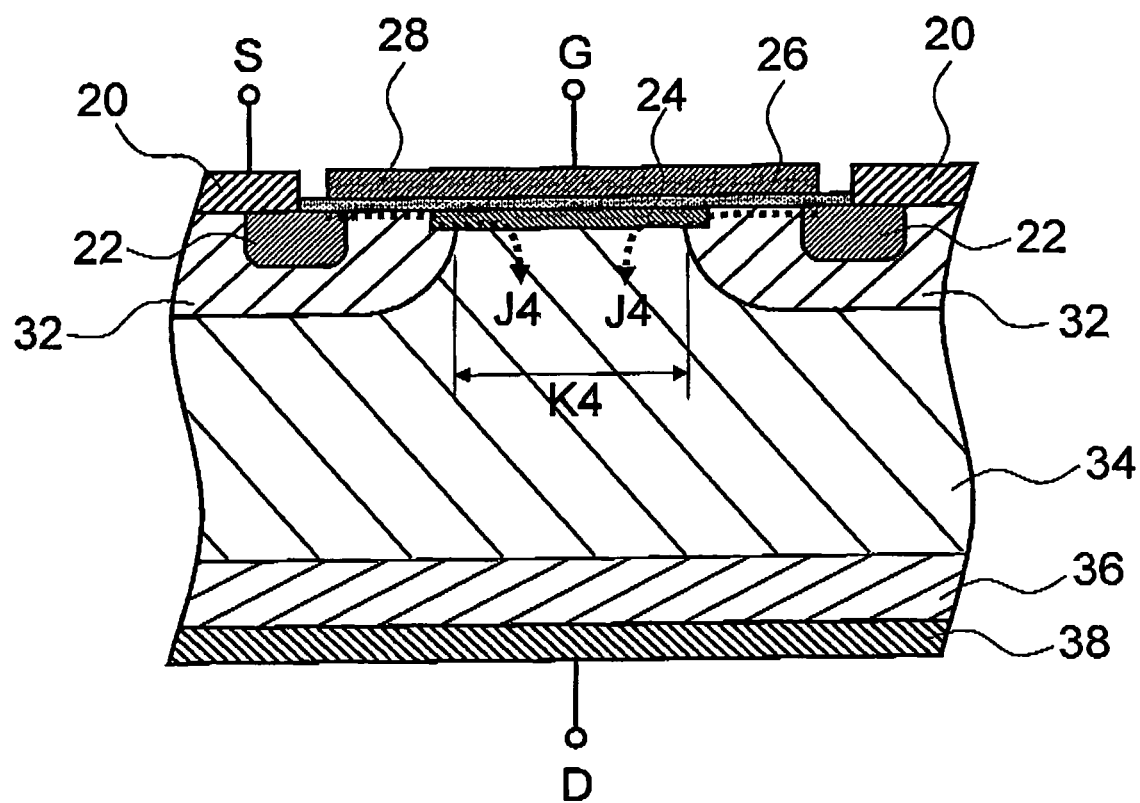
FIG. 8 is a schematic cross section of a semiconductor device configured as a planar MOSFET according to a fifth example of the invention.

FIG. 8 is a schematic cross section of a semiconductor device configured as a planar MOSFET according to a fifth example of the invention. With regard to this figure again, elements similar to those described above with reference to FIGS. 1 to 7 are marked with the same reference numerals and not described in detail.

In this example again, the p-type body layer 32 is selectively formed on the surface of the n⁻-type drift layer 34. The n+-type source layer 22 is selectively formed on the surface of the p-type body layer 32. An n-type accumulation channel layer 24 is provided so as to connect the adjacent p-type body layers 32 to each other. However, the p-type region 27 in the fourth example is not provided between the n-type accumulation channel layer 24 and the n+-type source layer 22, but instead the p-type body layer 32 forms an interface with the gate oxide film 26.

The end-to-end spacing K4 between the p-type body layers 32 can illustratively be 1 to 10 micrometers.

The electron flow 34 flows from the n+-type source layer 22 to the drain electrode 38 via the inversion layer channel region produced at the interface between the p-type body layer 32 and the gate oxide film 26, the n-type accumulation channel layer 24, and the n⁻-type drift layer 34. In this case again, the threshold can be increased to a desirable range by interposing the p-type body layer 32 between the source layer 22 and the accumulation channel layer 24. Thus a planar MOSFET semiconductor device can be achieved which has a low on-resistance, a high insulation breakdown voltage, and decreased malfunctions due to noise.

Semiconductor devices with planar structures have been described.

Next, semiconductor devices configured as MOSFETs with trench structures are described with reference to examples.

The trench structure is characterized in that it is suitable for increasing the packing density, which facilitates further decreasing the on-resistance. The gate insulating film is formed primarily on the side face of the trench, and thus the channel region is formed nearly vertical to the major surface of silicon carbide. However, its function is similar to that of the planar structure.

Figure 9:
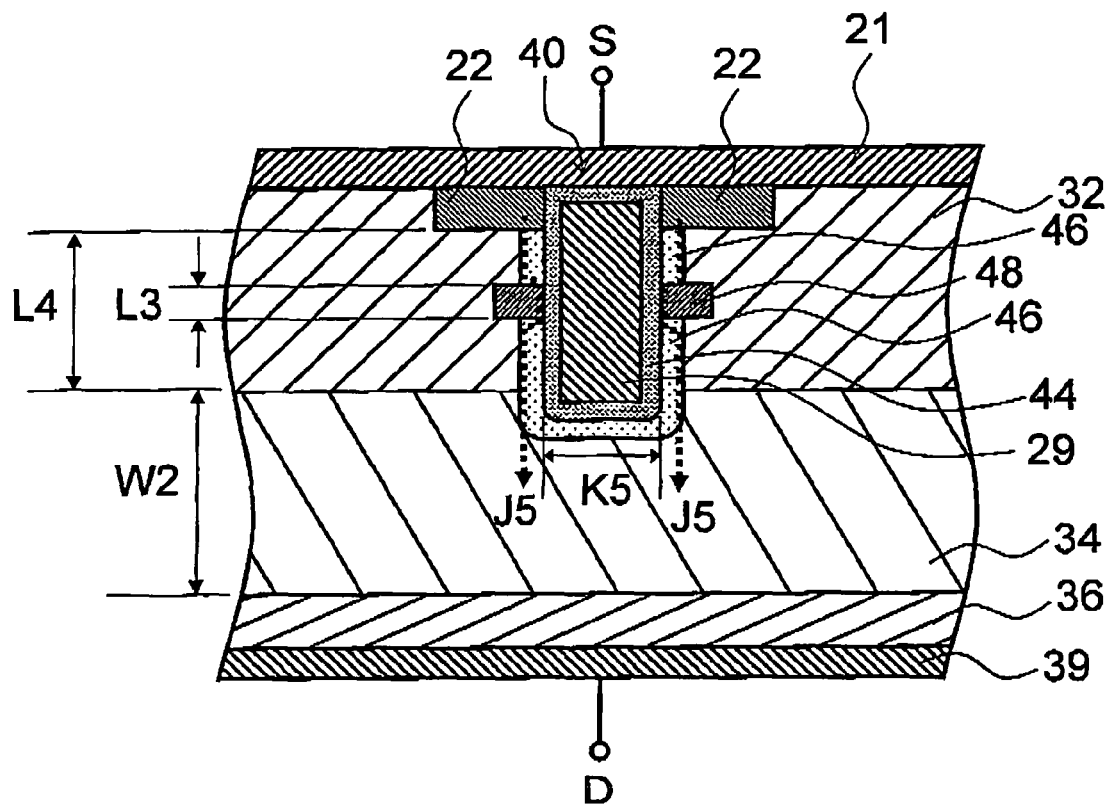
FIG. 9 is a schematic cross section of a semiconductor device configured as a trench MOSFET according to a sixth example of the invention.

FIG. 9 is a schematic cross section of a semiconductor device configured as a trench MOSFET according to a sixth example.

On an n$^+$-type drain layer (substrate) 36 of silicon carbide (SiC) are formed an n$^-$-type drift layer 34 and a p-type body layer 32. Here, when the device is illustratively designed to have a breakdown voltage of 1200 volts, the thickness W2 of the n$^-$-type drift layer 34 can illustratively be 10 micrometers, and the thickness of the p-type body layer 32 can illustratively be 1 to 5 micrometers. The width (or diameter) K5 of the trench 40 can illustratively be 0.1 to 2 micrometers. An oxide film 44 and a gate electrode 29 are formed in the trench 40. On the side face of the trench 40, an n-type accumulation channel layer 46 is formed opposite to the gate oxide film 44.

An n$^+$-type source layer 22 is formed on top of the n-type accumulation channel layer 46. The lower portion of the n-type accumulation channel layer 46 is connected to the n$^-$-type drift layer 34. The n$^+$-type source layer 22 is connected to a source electrode 21 on the surface side. The n$^-$-type drift layer 34 is connected to a drain electrode 39 via the n$^+$-type drain layer (substrate) 36. A p-type layer 48 is provided between the n$^+$-type source layer 22 and the n$^-$-type drift layer 34 so as to interrupt the electron flow path formed by the n-type accumulation channel layer 46.

The impurity concentration can illustratively be $1\times10^{19}$/cm$^3$ in the n$^+$-type drain layer (substrate) 36, $1\times10^{15}$ to $5\times10^{15}$/cm$^3$ in the n$^-$-type drift layer 34, $1\times10^{17}$ to $5\times10^{17}$/cm$^3$ in the p-type body layer 32, $1\times10^{18}$ to $10\times10^{18}$/cm$^3$ in the n$^+$-type source layer 22, and $1\times10^{16}$ to $10\times10^{16}$/cm$^3$ in the n-type accumulation channel layer 46.

In this example again, the n$^-$-type drift layer 34 can be provided with a smaller thickness W2 and a higher concentration because the silicon carbide material is used, which has about ten times higher avalanche breakdown electric field than silicon. Furthermore, in this example, an n-type accumulation channel layer 46 is provided between the p-type body layer 32 and the gate oxide film 44 so as to surround the side face and the bottom face of the trench 40.

The n-type accumulation channel layer 46 accumulates electrons to function as a channel. More specifically, when a positive bias voltage relative to the source electrode 21 is applied to the gate electrode 29, an n-channel is formed in the n-type accumulation channel layer 46. On the other hand, an inversion layer channel region is formed at the interface between the p-type layer 48 and the gate oxide film 44. Therefore the electron flow J5 from the n$^+$-type source layer 22 flows through the n-type accumulation channel layer 46 and the inversion layer channel region into the drain electrode 39. The n-type accumulation channel layer improves the interface electron mobility, and thus the on-resistance can be reduced.

The gate threshold voltage of the inversion layer channel region formed in the p-type layer 48 can illustratively be set to 5 volts or more, which is higher than that in the n-type accumulation channel layer 46. Thus malfunctions due to noise can be reduced. Here, let L3 be the length of the p-type layer 48 along the channel and L4 the length between the n$^+$-type source layer 22 and the n$^-$-type drift layer 34. The length of the n-type accumulation channel layer 46 is then (L4–L3). The gate threshold voltage in the inversion layer channel region can illustratively be set to 5 volts or more by selecting the channel length L3 of the p-type layer 48 to be 0.1 to 0.5 micrometer, for example. Thus malfunctions due to noise can be reduced. Furthermore, this example is suitable for increasing the packing density because of the trench configuration.

Figure 10:
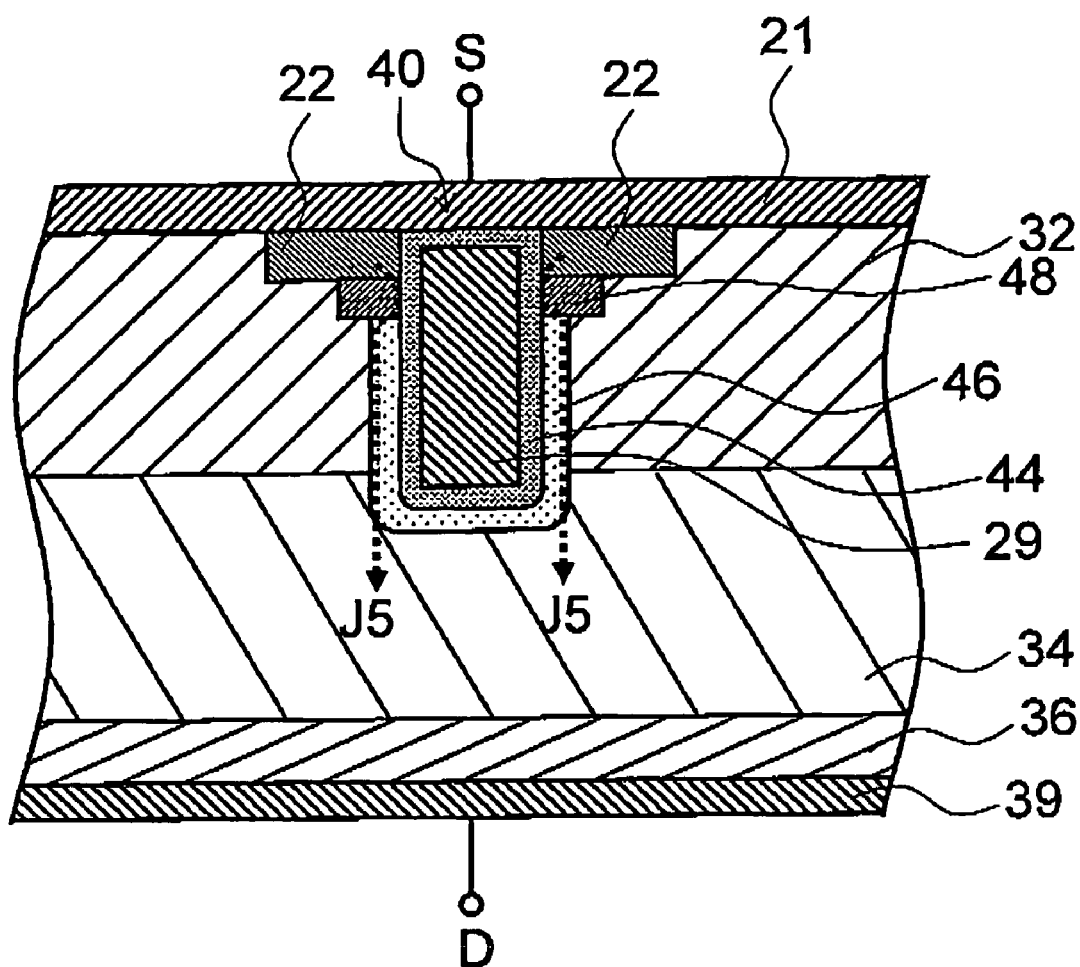
FIGS. 10 and 11 are schematic cross sections of a semiconductor device configured as a trench MOSFET according to a variation of the sixth example of the invention.
Figure 11:
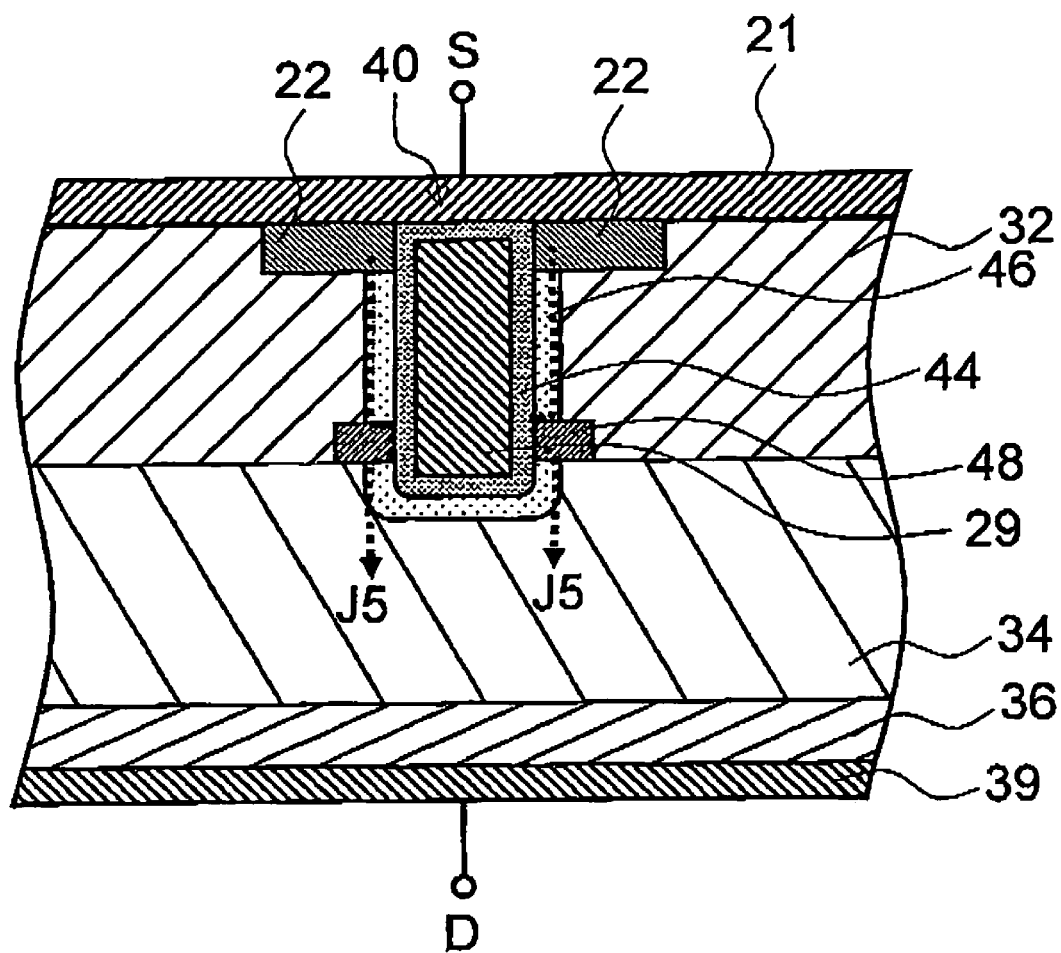

The position of the p-type layer 48 can be appropriately determined between the n$^+$-type source layer 22 and the n$^-$-type drift layer 34. That is, the p-type layer 48 may be provided close to the source layer 22 as illustrated in FIG. 10, or close to the drift layer 34 as Illustrated in FIG. 11.

Next, a process of manufacturing a trench MOS semiconductor device according to the sixth example is described.

FIGS. 12 to 18 are process cross sections showing the relevant part of the manufacturing process.

Figure 12:
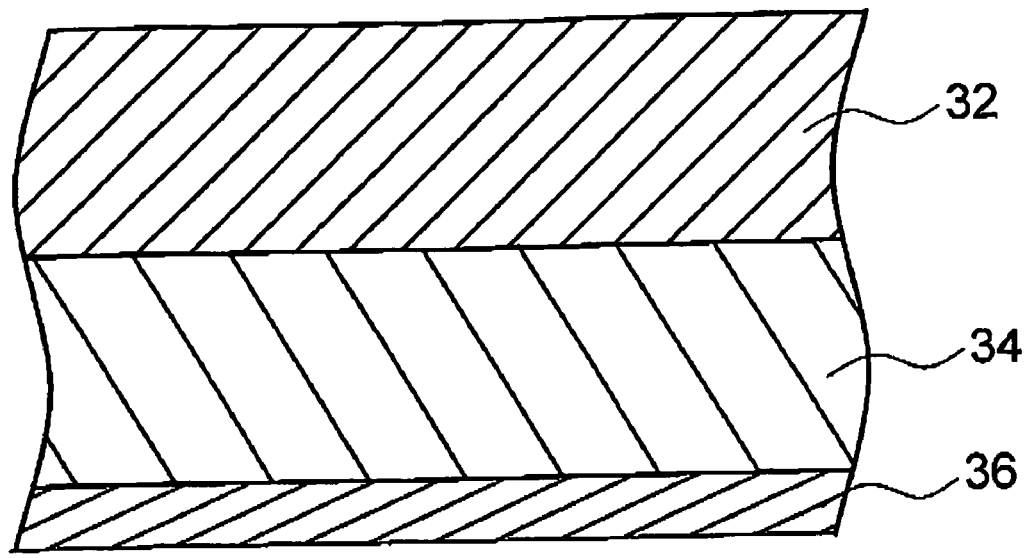
FIGS. 12 to 18 are process cross sections showing the relevant part of a process of manufacturing a trench MOS semiconductor device according to the sixth example of the invention.
Figure 13:
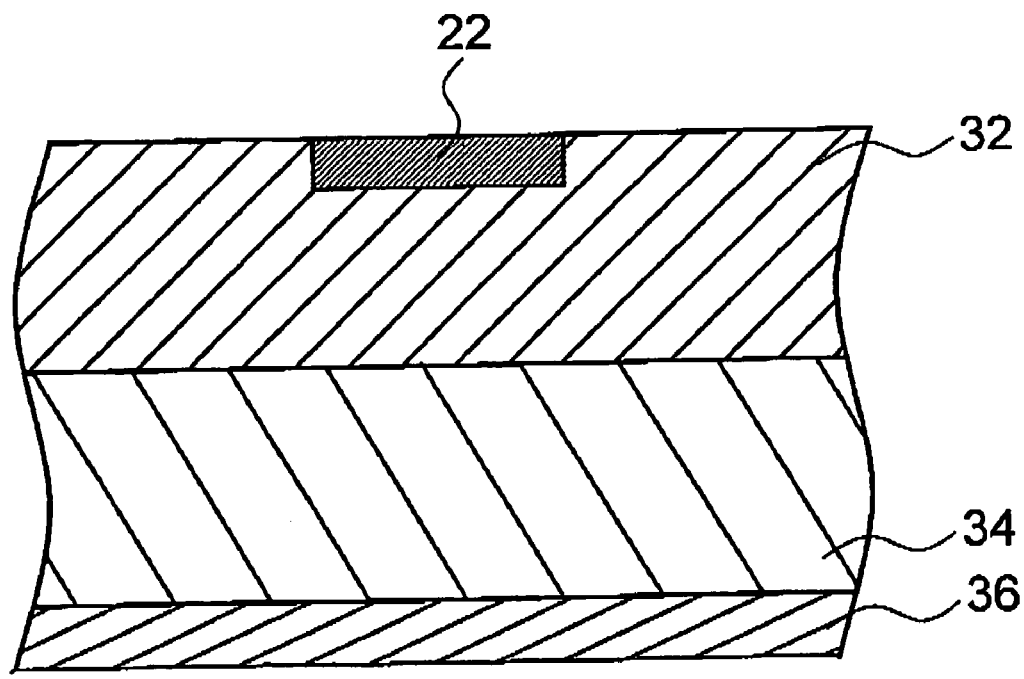

First, as illustrated in FIG. 12, an n$^-$-type drift layer 34 and a p-type body layer 32 are epitaxially grown on an n$^+$-type drain layer (substrate) 36. Then, as illustrated in FIG. 13, an n$^+$-type source layer 22 is partially formed by ion implantation, for example.

Figure 14:
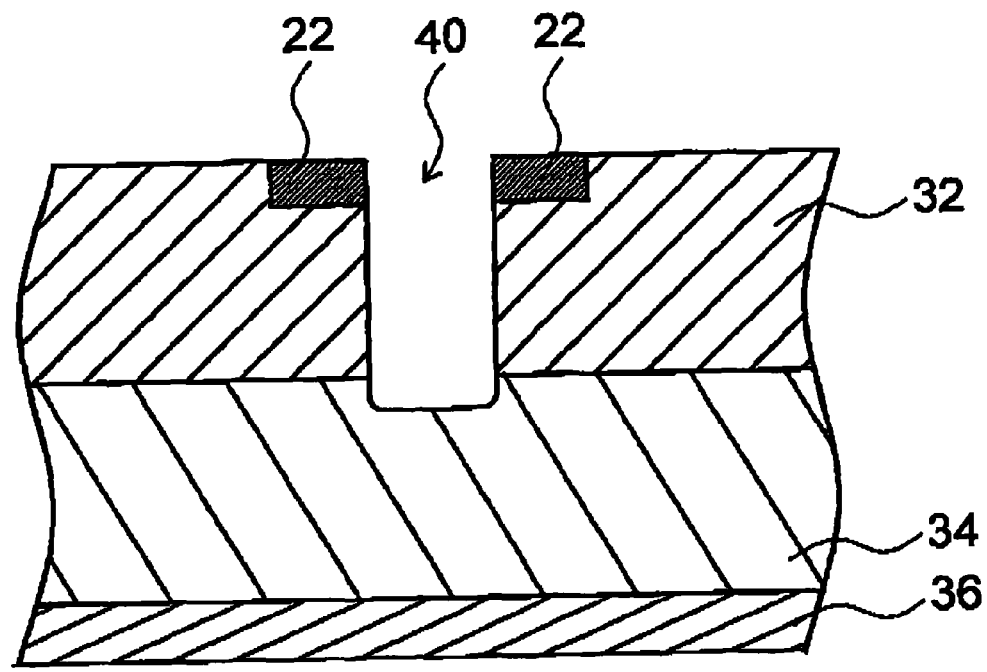
Figure 15:
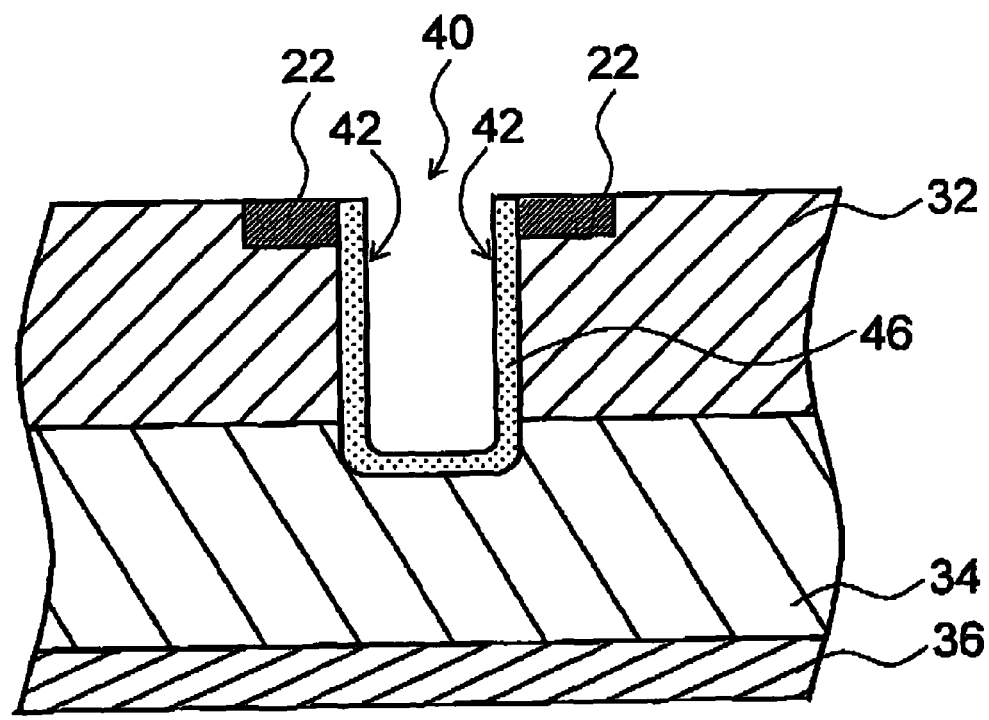
Figure 16:
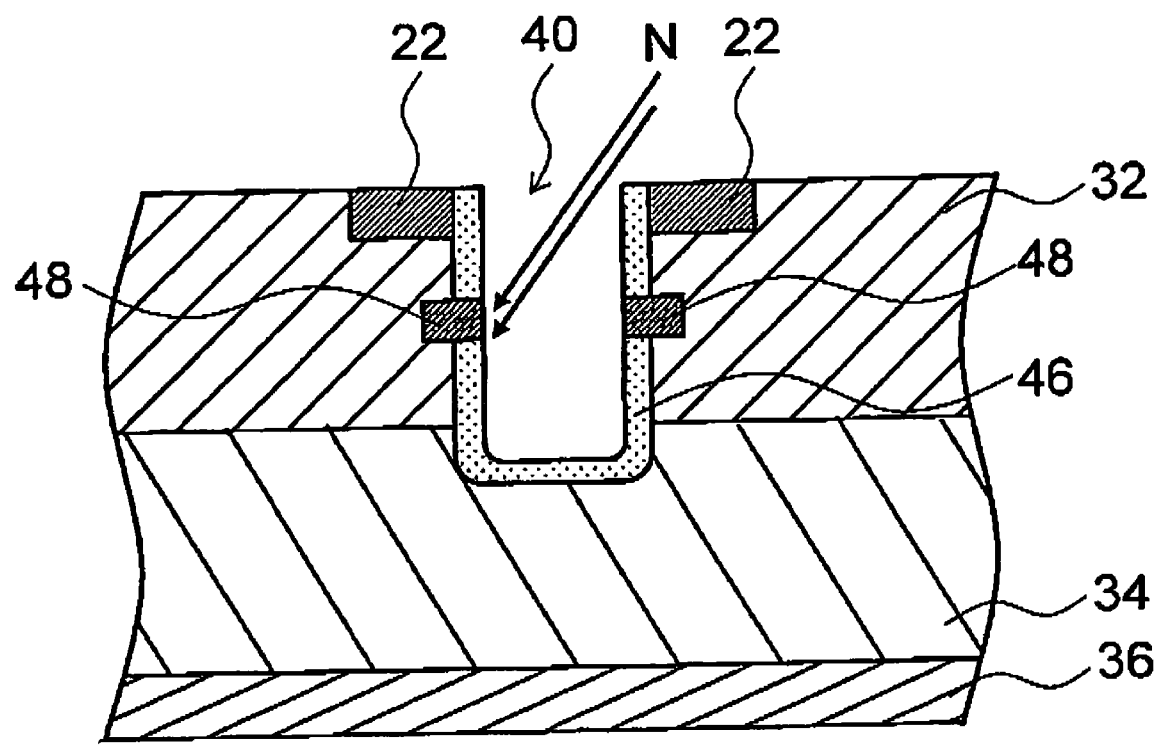

Subsequently, as illustrated in FIG. 14, a trench 40 is formed so as to reach the n$^-$-type drift layer 34. Then, as illustrated in FIG. 15, an n-type accumulation channel layer 46 containing donors such as nitrogen (N) or phosphorus (P) atoms is formed on the trench side face and the trench bottom face by such methods as low-angle Ion implantation and epitaxy. Subsequently, as illustrated in FIG. 16, a p-type layer 48 is selectively formed. Here, the ion beam is converged, and the ion implantation angle is appropriately selected, to inject boron (B) or other ions into a selected region between the n$^+$-type source layer 22 and the bottom face of the trench 40. At this time, a mask (not shown) may be formed on the side face or bottom face of the trench, and p-type impurities may be introduced through the opening of the mask to form the p-type layer 48.

Figure 17:
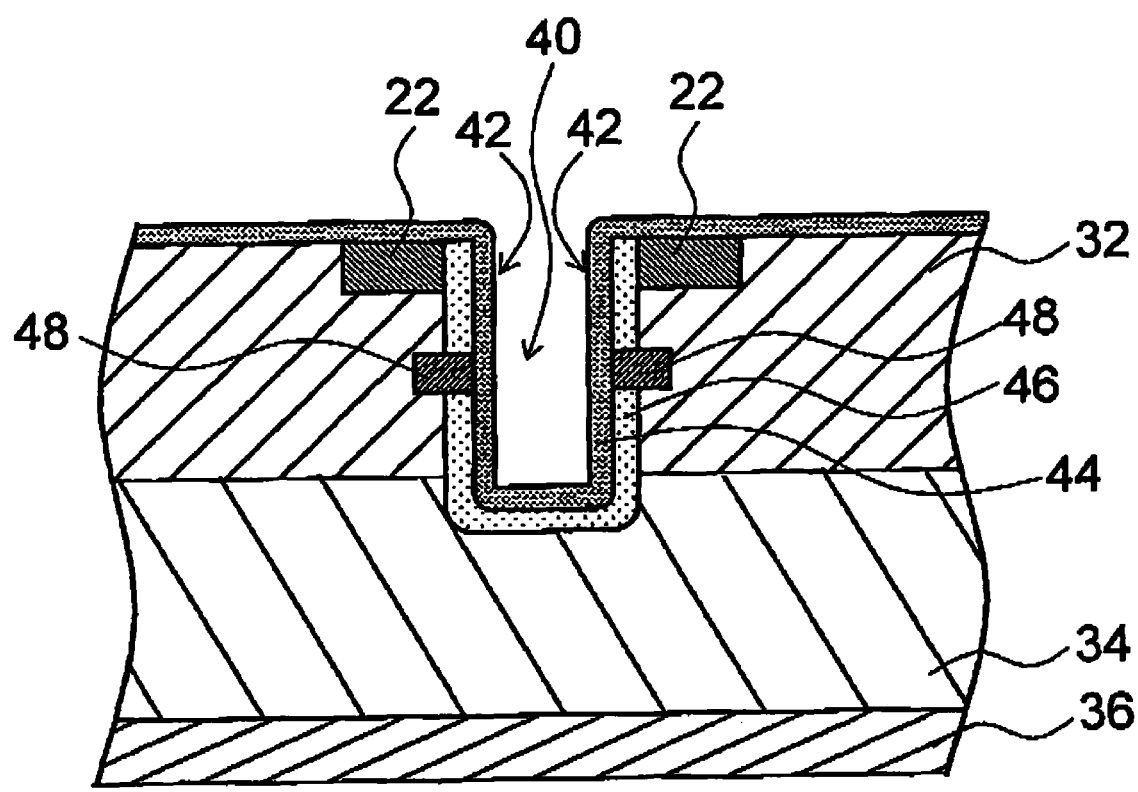
Figure 18:
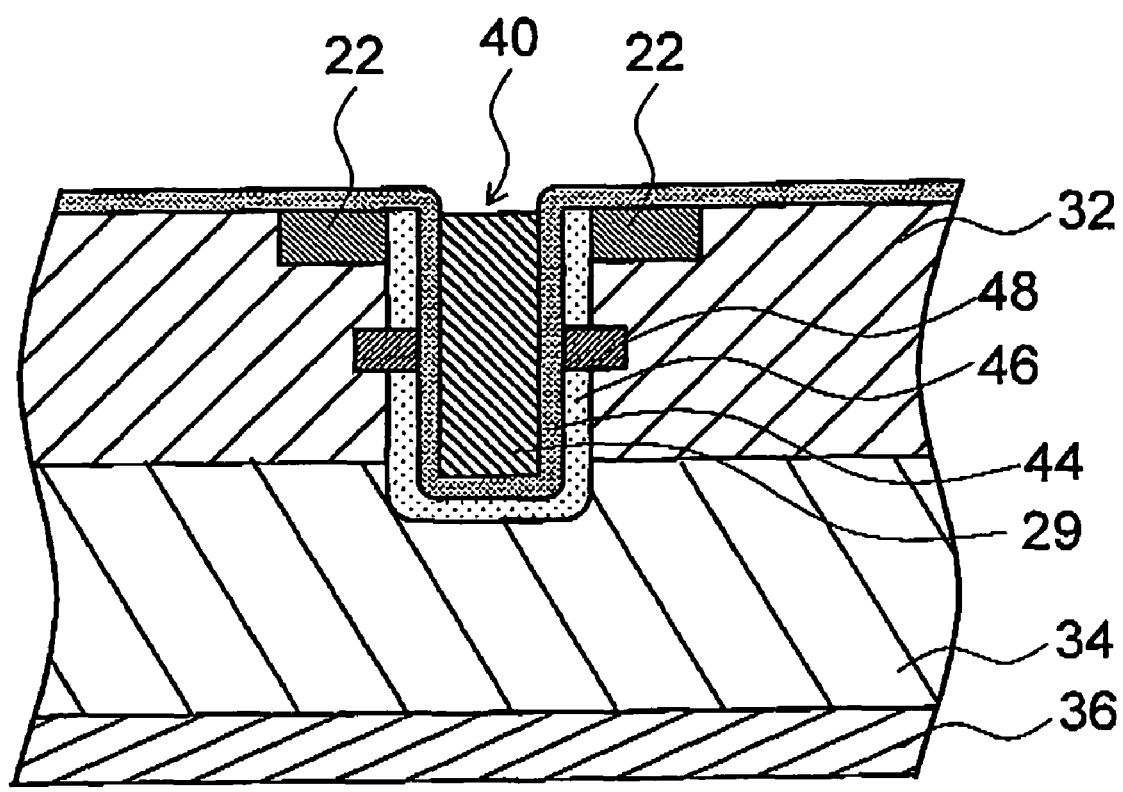

Subsequently, as illustrated in FIG. 17, an oxide film Is formed on the trench side face 42, the trench bottom face, and the wafer surface by thermal oxidation, for example. A gate oxide film 44 is formed on the trench side face 42. Then, as illustrated in FIG. 18, a gate electrode 29 of polysilicon or the like is packed in the trench 40. The top of the gate electrode 29 is covered with an insulating film, on which a source electrode 21 is formed. A drain electrode 39 is formed on the rear face. Thus the relevant part of a MOS semiconductor device illustrated in FIG. 9 is completed.

In an aspect of the manufacturing process described above, a trench 40 is formed in a silicon carbide material, and then an n-type accumulation channel layer 46 and a p-type layer 48 are provided on the side face of the trench 40 using low-angle ion implantation. The n-type accumulation channel layer 46 thus provided improves the interface electron mobility, which leads to a higher electron mobility. Thus a trench MOSFET semiconductor device can be achieved which has a low on-resistance, a gate threshold voltage of 5 volts or more, and an improved insulation breakdown voltage.

Figure 19:
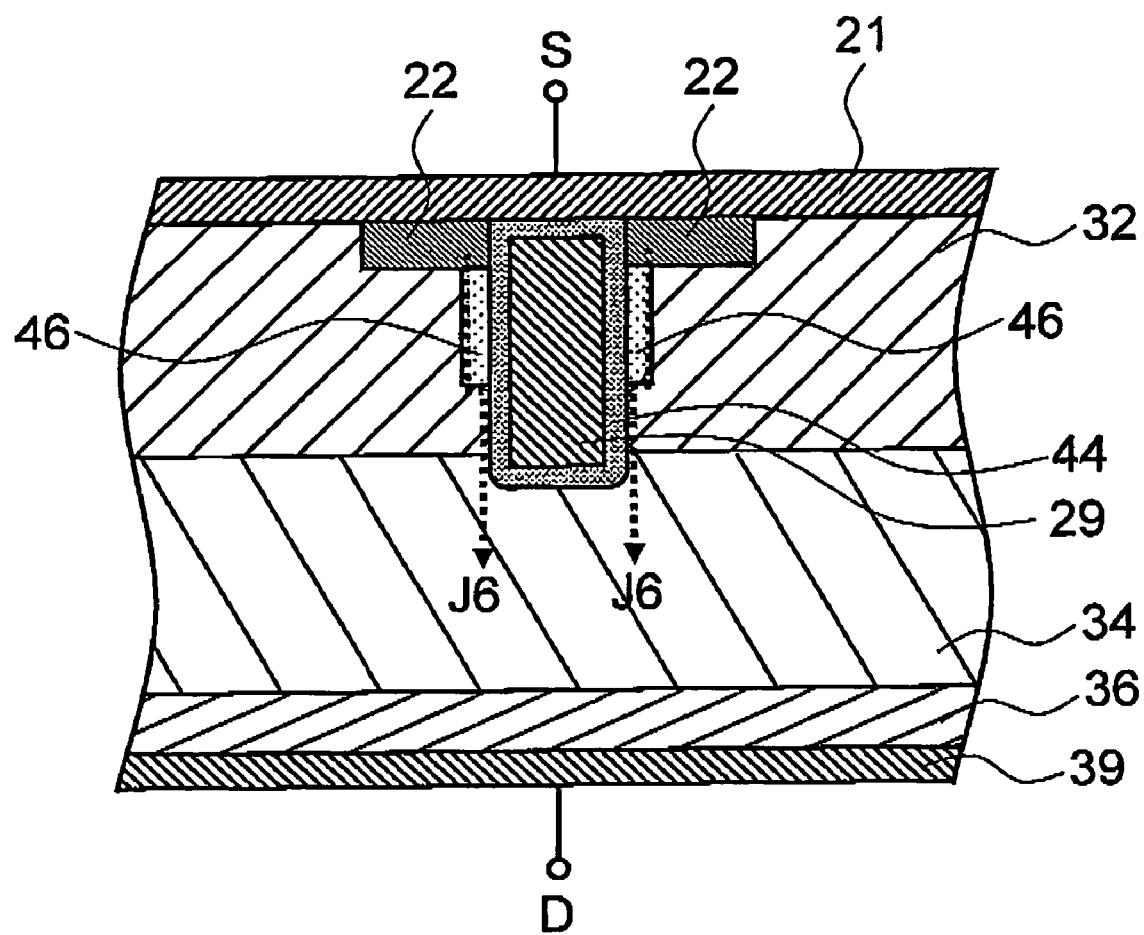
FIG. 19 is a schematic cross section of a silicon carbide semiconductor device configured as a trench MOSFET according to a seventh example of the invention.

FIG. 19 is a schematic cross section of a silicon carbide semiconductor device configured as a trench MOSFET according to a seventh example of the invention. Elements similar to those described above with reference to FIGS. 1 to 17 are marked with the same reference numerals and not described in detail.

In this example, the n-type accumulation channel layer 46 is formed shallower than in the sixth example, and no p-type layer is provided. Instead of the p-type layer 48 in the sixth example, the p-type body layer 32 forms an interface with the gate oxide film 44.

In this configuration as well, in the ON state, an inversion layer channel region is formed at the interface between the p-type body layer 32 and the gate oxide film 44, and the gate threshold voltage in this region can be made higher than in the n-type accumulation channel layer. This structure can also be achieved by using low-angle ion implantation in the process of injecting nitrogen or other ions. According to this example, the protrusion of the high-concentration layer can be prevented, and thus a higher breakdown voltage can be achieved. Here, the dashed line J6 represents the electron flow.

Next, the planar configuration of the trench illustrated in FIGS. 9 and 19 is described.

More specifically, the trench of the semiconductor device illustrated in FIGS. 9 and 19 as a cross-sectional structure may illustratively have a planar configuration of a groove extending in one direction, or a hole having a circular, tetragonal, or hexagonal planar shape.

When the trench is like a groove, the groove-like trenches can be arranged generally parallel to each other for integration.

When the trench has a circular planar shape, the trenches can be arranged in a predetermined pattern for integration.

Figure 20:
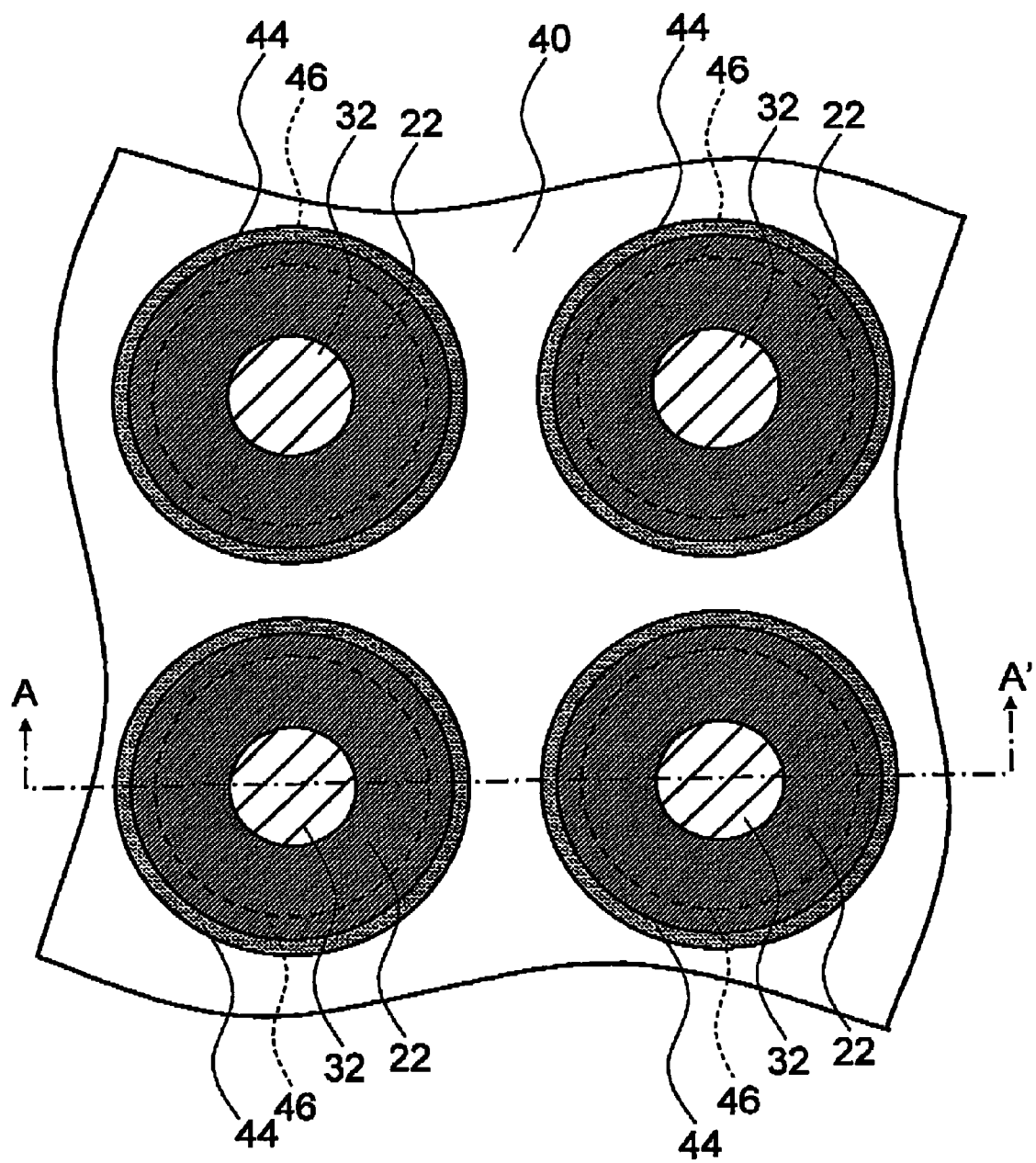
FIGS. 20 and 21 are schematic views showing an example where trenches having a circular planar shape are integrated.
Figure 21:
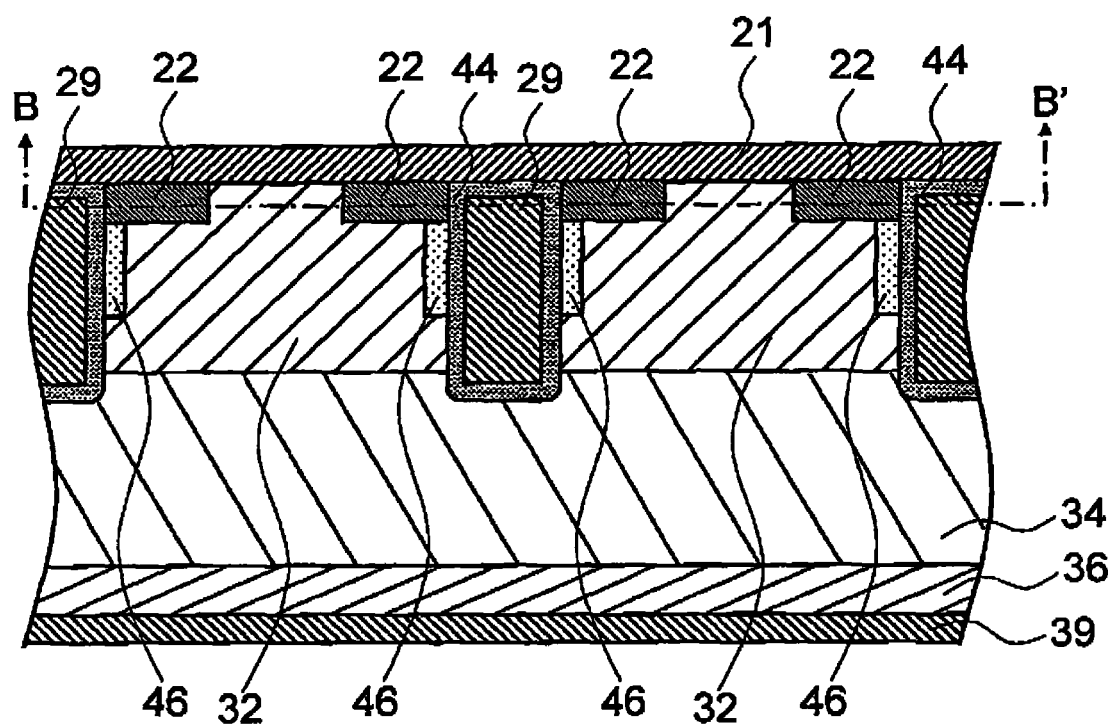

FIGS. 20 and 21 are schematic views showing an example where trenches having a circular planar shape are integrated. Here, FIG. 20 is a schematic plan view along the dot-dashed line B-B' in FIG. 21, and FIG. 21 is a schematic cross section along the dot-dashed line A-A' in FIG. 20.

More specifically, the $n^+$-type source layer 22, the n-type accumulation channel layer 46, and the p-type body layer 32 are arranged in a cylindrical configuration, on the periphery and bottom of which is formed an oxide film 44. In such an integrated structure again, the threshold voltage can be suitably increased to reduce malfunctions due to noise, and also a MOSFET semiconductor device having a low on-resistance is achieved.

Figure 22:
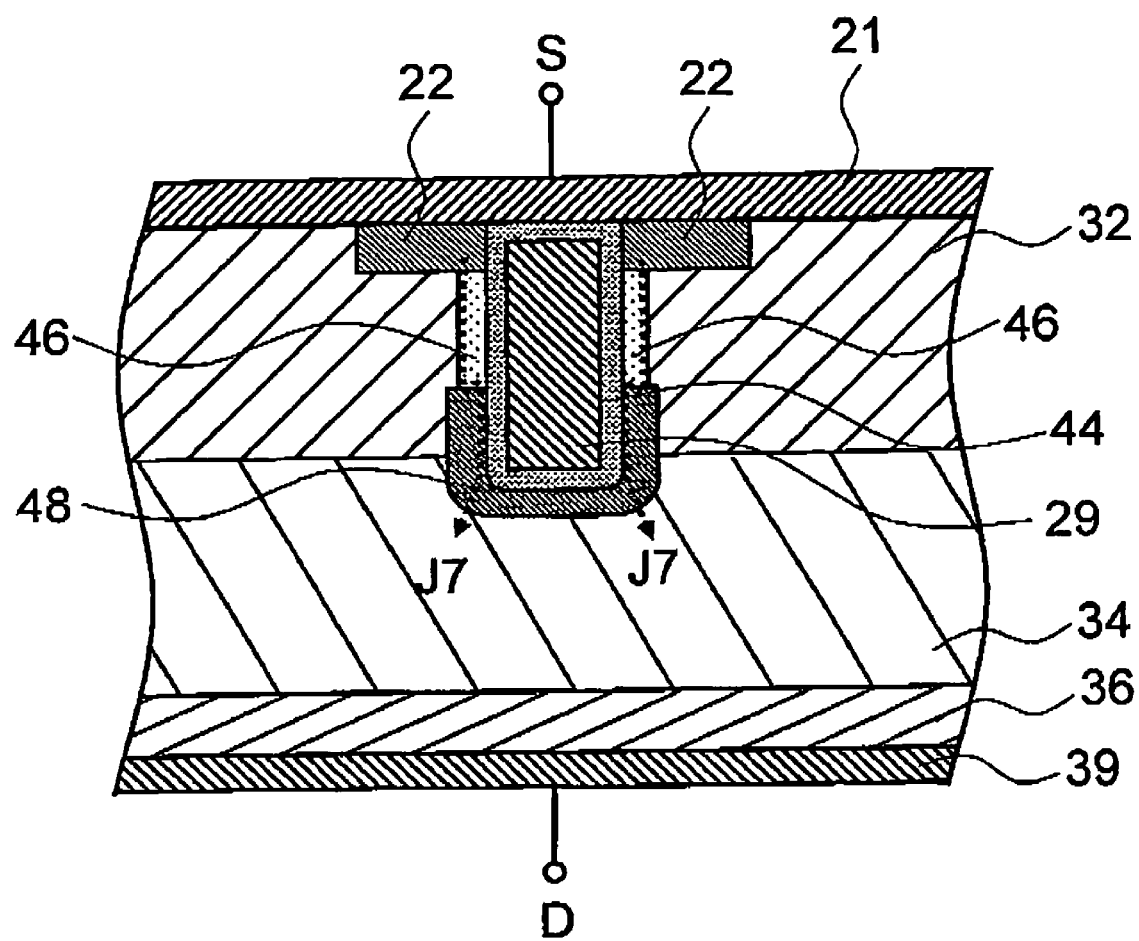
FIG. 22 is a schematic cross section of a silicon carbide semiconductor device configured as a trench MOS semiconductor device according to an eighth example of the invention.

FIG. 22 is a schematic cross section of a silicon carbide semiconductor device configured as a trench MOS semiconductor device according to an eighth example of the invention. With regard to this figure again, elements similar to those described above with reference to FIGS. 1 to 21 are marked with the same reference numerals and not described in detail.

In this example, a p-type layer 48 is provided to extend across the p-type body layer 32 and the $n^-$-type drift layer 34. The n-type accumulation channel layer 46 is formed so as to connect to the top of the p-type layer 48. According to this example, the carrier concentration and size of the p-type layer 48 can be adjusted to facilitate obtaining an optimal gate threshold. The p-type layer 48 at the trench bottom weakens the electric field applied to the gate oxide film 44 even when a high voltage is applied between the gate and drain electrodes. Advantageously, this improves the reliability of the gate oxide film 44.

Figure 23:
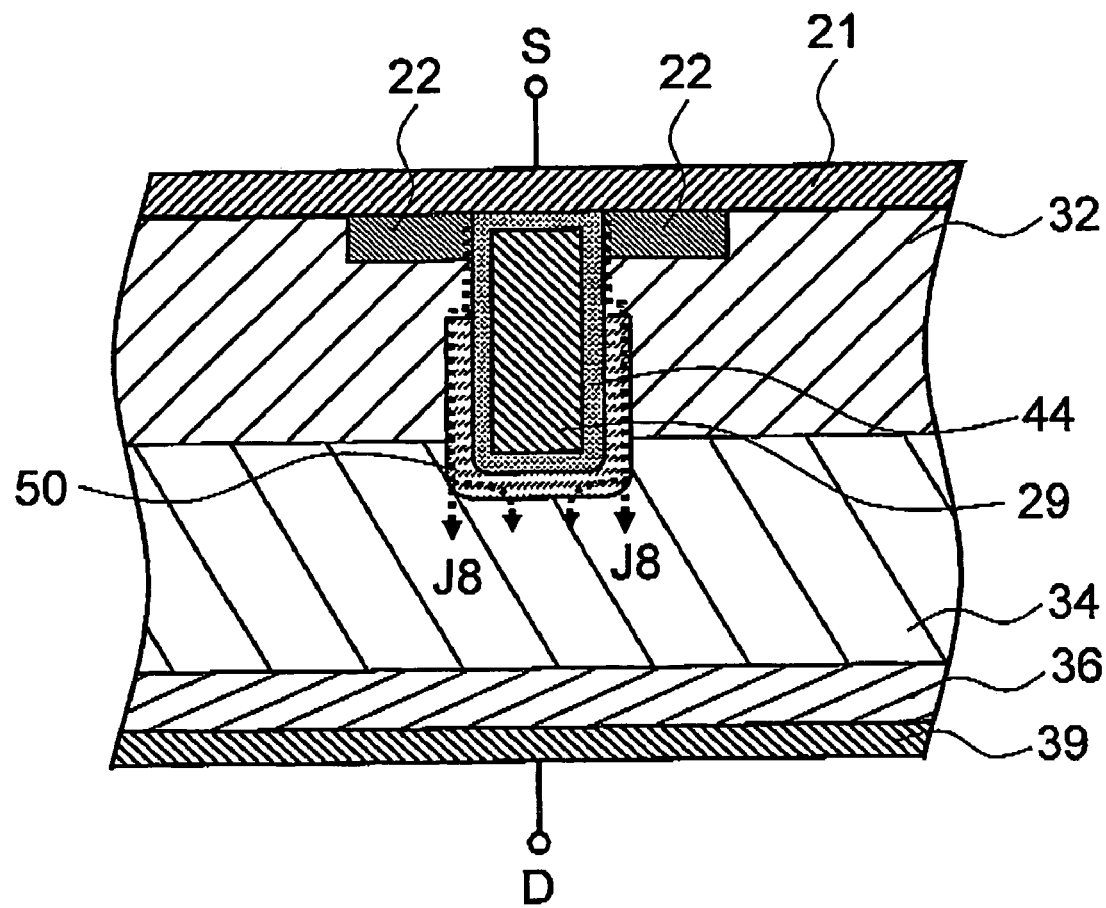
FIG. 23 is a schematic cross section of a silicon carbide semiconductor device configured as a trench MOSFET according to a ninth example of the invention.

FIG. 23 is a schematic cross section of a silicon carbide semiconductor device configured as a trench MOSFET according to a ninth example of the invention. With regard to this figure again, elements similar to those described above with reference to FIGS. 1 to 22 are marked with the same reference numerals and not described in detail.

In this example, an n-type accumulation channel layer 50 is provided to surround the bottom of the trench 40. Because the p-type body layer 32 is interposed in the current path between the n-type accumulation channel layer 50 and the source layer 22, the threshold voltage can be suitably increased. As a result, a MOSFET semiconductor device can be achieved which has a low on-resistance and decreased malfunctions due to noise. The n-type accumulation channel layer 50 provided at the bottom of the trench 40 directs the current J8 also from the vicinity of the trench bottom face to the $n^-$-type drift layer 34 as illustrated by arrows in FIG. 23. As a result, advantageously, the on-resistance can be further reduced.

Figure 24:
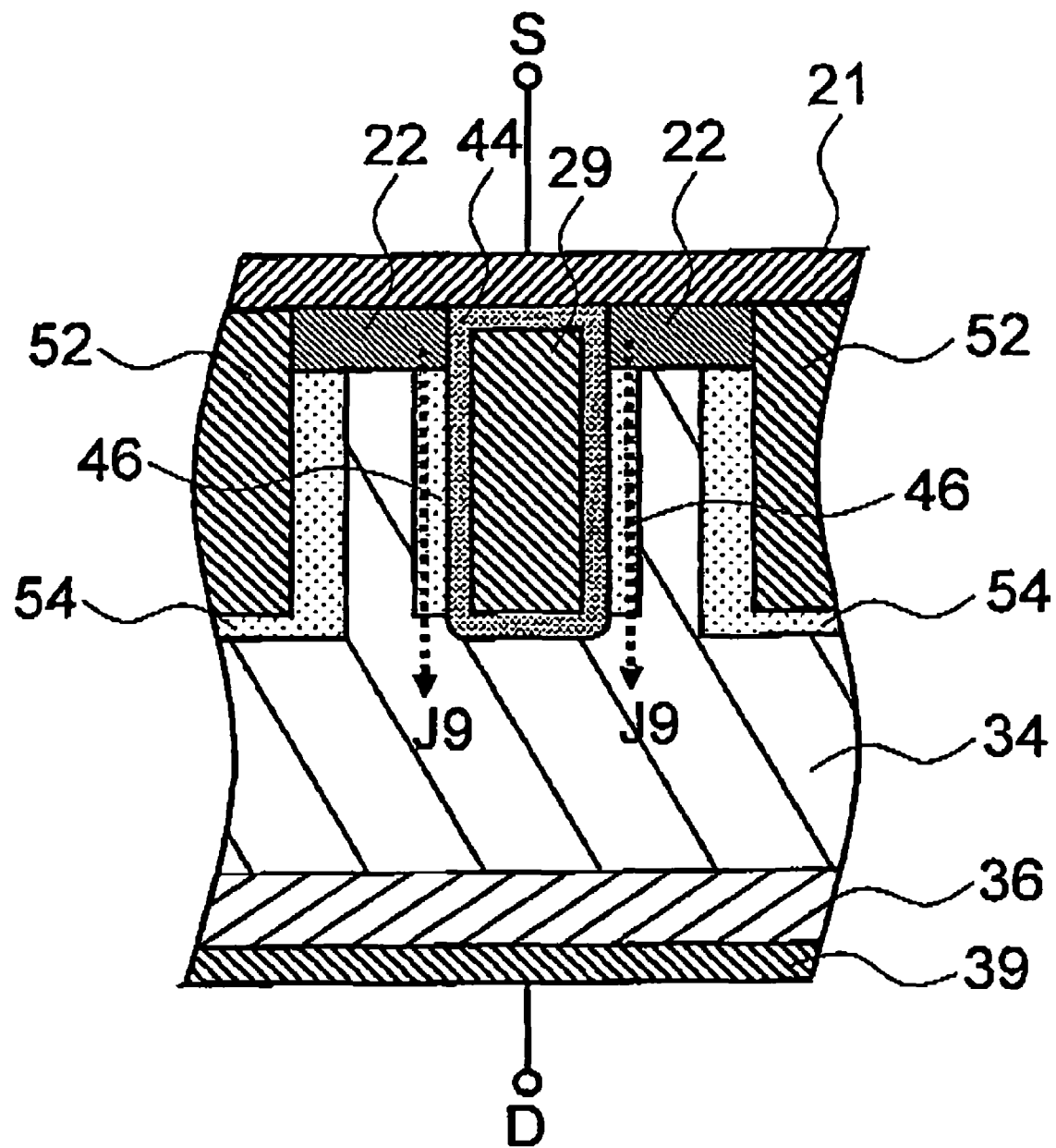
FIG. 24 is a schematic cross section of a silicon carbide semiconductor device configured as a trench MOSFET according to a tenth example of the Invention.

FIG. 24 is a schematic cross section of a silicon carbide semiconductor device configured as a trench MOSFET according to a tenth example of the invention. With regard to this figure again, elements similar to those described above with reference to FIGS. 1 to 23 are marked with the same reference numerals and not described in detail.

In contrast to the first to ninth examples, this example has no p-type body layer, but has a trench-type contact 52 and a $p^+$-type layer 54 surrounding it. The $p^+$-type layer 54 is electrically connected with the source electrode 21. The spacing between the $p^+$-type layer 54 and the n-type accumulation channel layer 46 can be decreased to some extent, and the depth of the $p^+$-type layer 54 can be made equivalent to or more than that of the gate electrode 29, thereby making the device normally off without the p-type body layer. That is, the depletion layer extending from the p-n junction formed between the $n^-$-type drift layer 34 and the $p^+$-type layer 54 can deplete the accumulation channel layer 46 when the gate voltage is turned off.

For example, approximately, the $n^-$-type drift layer 34 has a carrier concentration of $1\times10^{13}$ to $5\times10^{15}/cm^3$, the $p^+$-type layer 54 has a carrier concentration of $1\times10^{19}/cm^3$, the accumulation channel layer 46 has a carrier concentration of $1\times10^{16}$ to $10\times10^{16}/cm^3$, and the spacing between the $p^+$-type layer 54 and the accumulation channel layer 46 is 2 micrometers or less. Then, when no gate voltage is applied, the accumulation channel layer 46 can be depleted almost completely to achieve the normally-off state.

In this example again, the electron flow J9 in the ON state flows through the accumulation channel layer 46 as shown by arrows. As a result, a MOSFET semiconductor device can be achieved which has a low on-resistance and decreased malfunctions due to noise.

Figure 25:
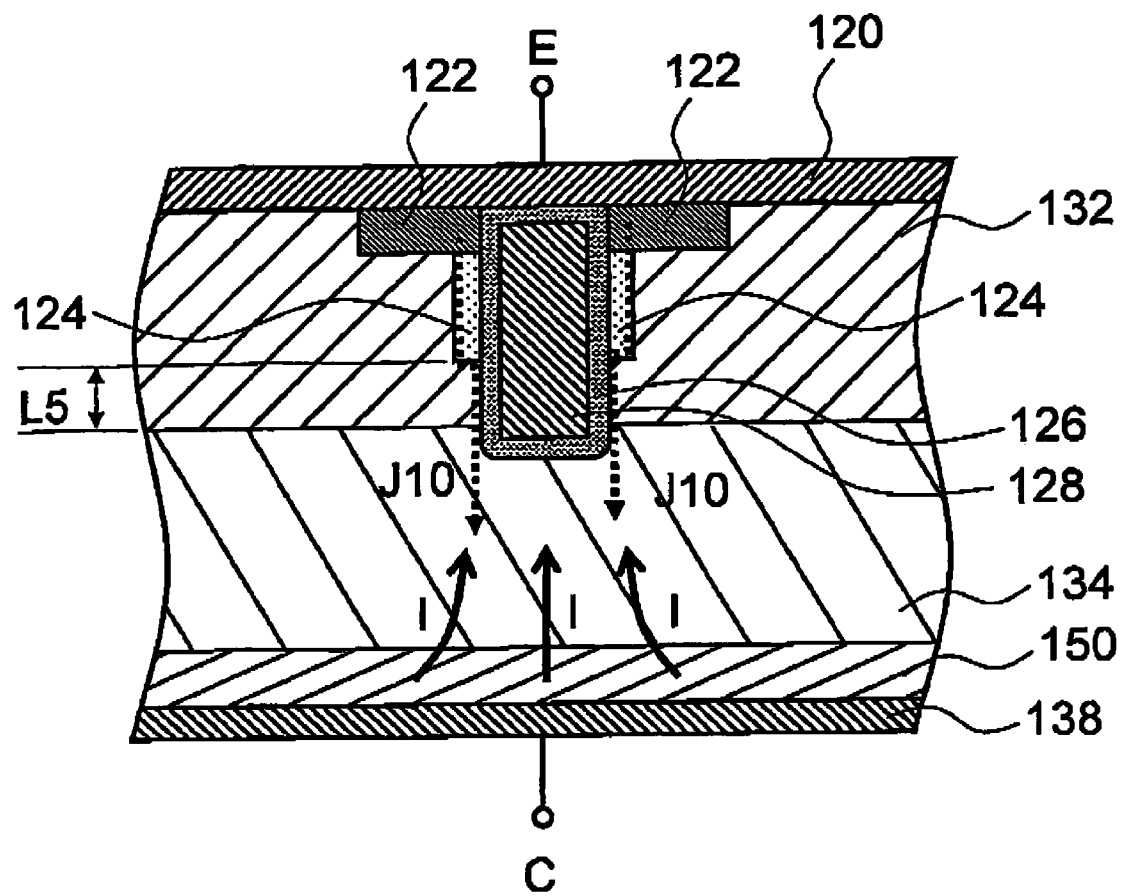
FIG. 25 is a schematic cross section of an IGBT (Insulated Gate Bipolar Transistor) configured as a MOS semiconductor device according to an eleventh example of the invention.

FIG. 25 is a schematic cross section of an IGBT (Insulated Gate Bipolar Transistor) configured as a MOS semiconductor device according to an eleventh example of the Invention.

On a $p^+$-type emitter layer 150 of silicon carbide are formed an $n^-$-type drift layer 134 and a p-type body layer 132. A trench is formed so as to cut through the p-type body layer 132. Adjacent to the trench side face, an n-type accumulation channel layer 124 is formed to be connected to the $n^+$-type layer 122. An oxide film 126 is formed on the trench side face, and a gate electrode 128 is formed further inside. Isolated from the gate electrode 128, an emitter electrode 120 is formed on the wafer upper face, and a collector electrode 138 is formed on the wafer lower face.

The $p^+$-type emitter layer 150 can be formed by an epitaxial growth on the rear surface of the $n^-$-type drift layer 134 and by diffusing a p-type impurity onto the rear surface of the $n^-$-type drift layer 134, for example. These fabrication methods are different from the case of a device made of silicon, where $p^+$-type substrate is used and the $n^+$-drift layer is epitaxially grown on the $p^+$-type substrate. In the case of devices made of SiC, a $p^+$-type substrate is not readily available, which is why the aforementioned unique fabrication process are performed in the case of SiC devices. The method can be appropriately employed in any one of the aforementioned embodiments in order to form the $p^+$-type emitter layer.

The IGBT according to the Invention has a lower on-resistance than MOSFETs based on silicon carbide materials, particularly at breakdown voltages over thousands of volts.

Between the $n^+$-type source layer 122 and the $n^-$-type drift layer 134, the n-type accumulation channel layer 124 is provided adjacent to the $n^+$-type layer 122 and opposite to the gate oxide film 126. Here, the p-type body layer 132 is opposed to the gate oxide film 126 to form an inversion layer channel region. The concentration in the inversion layer channel region can be appropriately selected to increase the gate threshold voltage in the inversion layer channel region higher than the gate threshold voltage in the n-type accumulation channel layer 124.

When an ON signal is applied to the gate electrode 128, the MOSFET region becomes conductive to produce an electron current J10. At the same time, a hole current I is injected from the p$^+$-type emitter layer 150. As a result, conductivity modulation occurs, and thus the voltage drop in the n$^-$-type drift layer 134 can be made lower than in conventional MOSFETs. Furthermore, an IGBT having a low on-resistance, a high insulation breakdown voltage, and decreased malfunctions due to noise can be achieved. Note that a similar IGBT can also be achieved using the structures of the first to tenth examples by providing a p-type emitter layer on the rear side of the n-type drain layer (substrate) 36.

The embodiment of the invention has been described with reference to the examples. However, the invention is not limited to these examples. For example, the conductivity types of elements in the structures shown in the first to eleventh examples may be reversed.

Furthermore, the material, carrier concentration, impurity, thickness, and positional relationship of each element in the semiconductor device that are adapted by those skilled in the art are also encompassed within the scope of the invention as long as they include the features of the invention.

For example, in the trench MOSFET, the insulating film at the bottom of the trench may be formed thicker than the insulating film of the sidewall.

Figure 26:
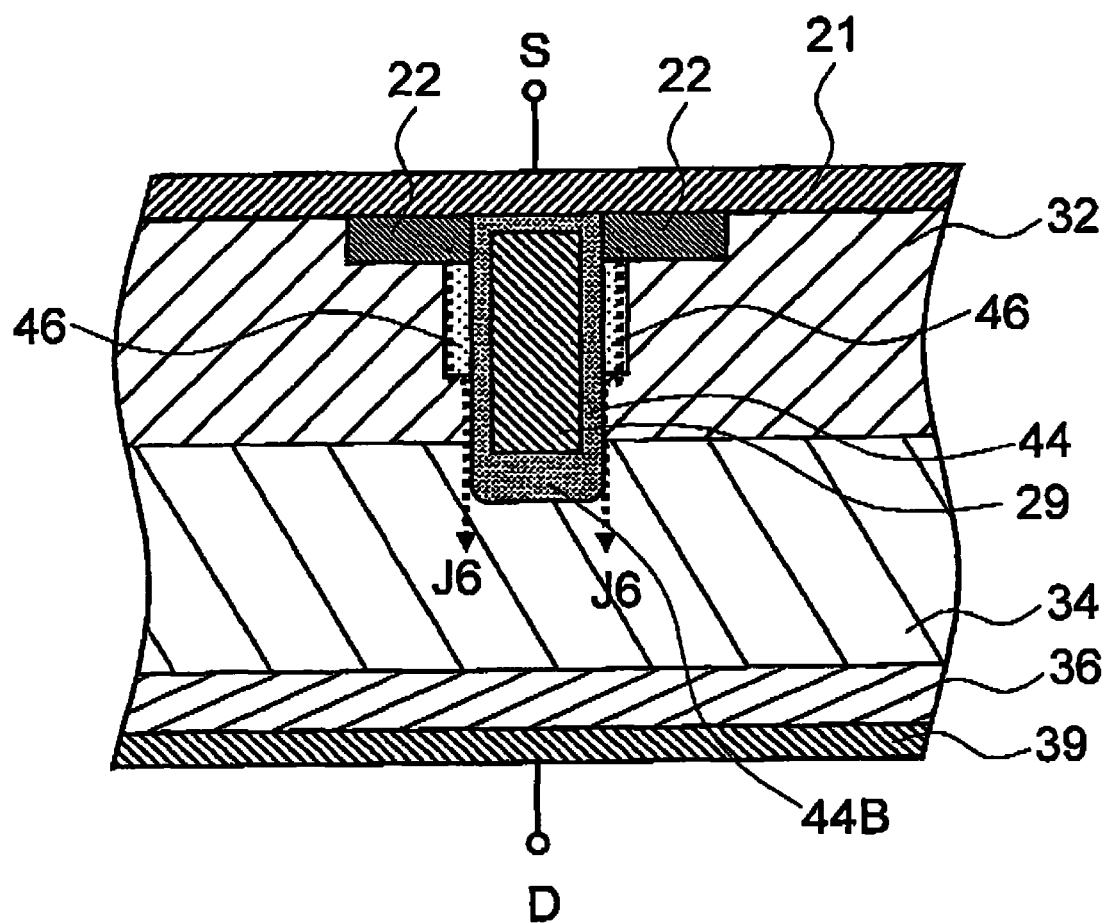
FIG. 26 is a schematic cross section illustrating a semiconductor device, which has a thickened insulating film at the trench bottom.

FIG. 26 is a schematic cross section illustrating a semiconductor device, which has a thickened insulating film at the trench bottom. With regard to this figure again, elements similar to those described above with reference to FIGS. 1 to 25 are marked with the same reference numerals and not described in detail.

More specifically, the gate oxide film 44B at the bottom of the trench is formed thicker than the gate oxide film on the sidewall of the trench. The electric field is likely to be concentrated at the bottom of the trench because it includes a portion of large curvature. The applied electric field is particularly higher in the case of MOSFETs and the like based on silicon carbide. In this respect, according to this example, the gate oxide film 44B at the trench bottom can be thickened to prevent breakdown due to the electric field and increase reliability. Furthermore, the gate-drain parasite capacitance can also be reduced by thus thickening the insulating film. Note that a similar function and effect can also be achieved by thus thickening the insulating film at the trench bottom in any of the structures illustrated in FIGS. 9 to 25.

On the other hand, the insulating film can also be protected by covering the trench bottom with a p-type layer.

Figure 27:
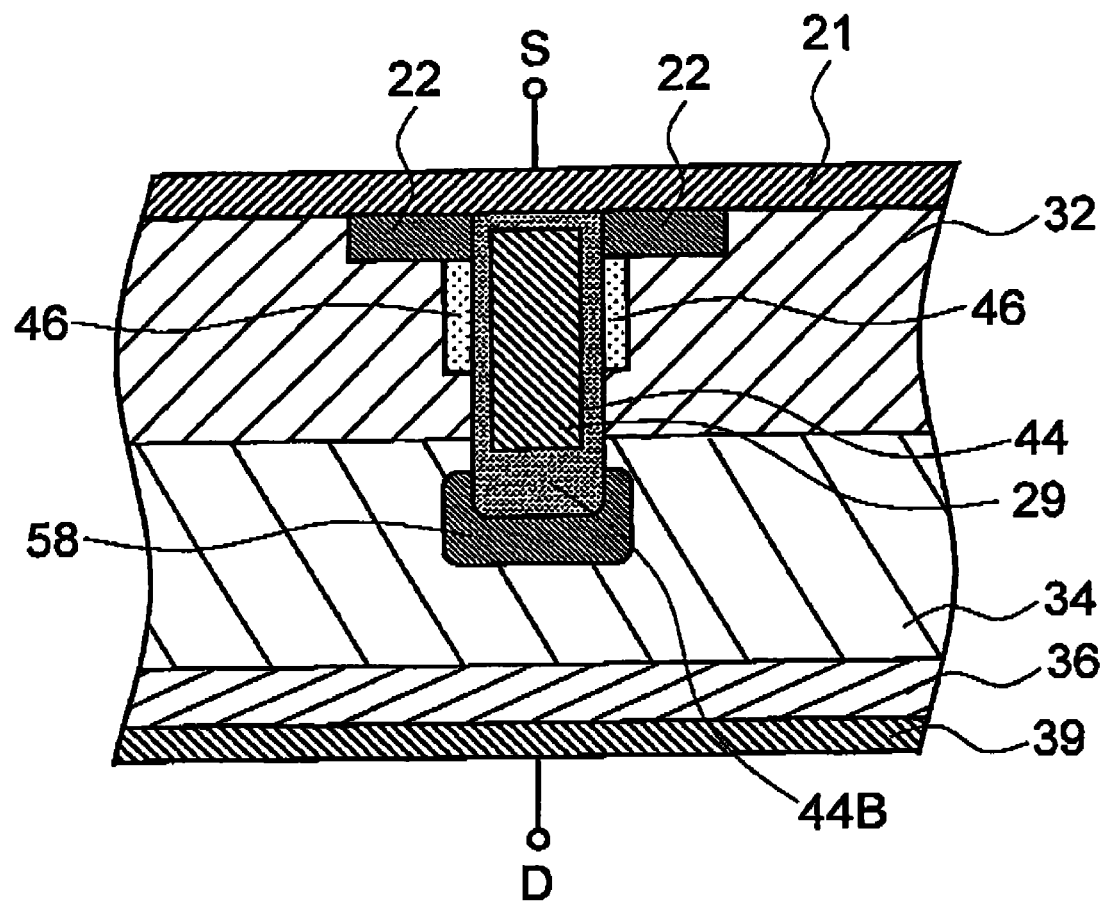
FIG. 27 is a schematic cross section showing an example, which has a p-type layer 58 so as to cover the trench bottom.

FIG. 27 is a schematic cross section showing an example, which has a p-type layer 58 so as to cover the trench bottom.

With such a p-type layer 58, the electric field applied to the gate oxide film at the trench bottom can be mitigated, and the gate oxide film can be protected. As a result, the breakdown due to the electric field can be prevented, and the reliability can be increased. Note that a similar function and effect can also be achieved by thus covering the trench bottom with a p-type layer in any of the structures illustrated in FIGS. 9 to 21 and FIGS. 23 to 25.

In an aspect of the invention, in the semiconductor device according to the aforementioned embodiments, the inversion channel layer may appropriately be formed in the second semiconductor layer.

In the semiconductor device according to the aforementioned embodiments, the accumulation channel layer may appropriately be depleted when an ON voltage is not applied to the gate electrode.

The semiconductor device according to the aforementioned embodiments may appropriately further comprise a main electrode layer of a first conductivity type provided below the first semiconductor layer, the main electrode layer having higher concentration than the first semiconductor layer.

The semiconductor device according to the aforementioned embodiments may appropriately further comprise a main electrode layer of a second conductivity type provided below the first semiconductor layer, the main electrode layer having higher concentration than the first semiconductor layer.

The invention claimed is:

1. A semiconductor device comprising:
   a first semiconductor layer of silicon carbide of a first conductivity type;
   a second semiconductor layer of silicon carbide of a second conductivity type selectively provided on the first semiconductor layer;
   a main electrode layer of silicon carbide of the first conductivity type selectively provided on the second semiconductor layer;
   a gate insulating film provided on the second semiconductor layer;
   a gate electrode formed on the gate insulating film; and
   a third semiconductor layer of the first conductivity type intervening a current path which is formed between the main electrode layer and the first semiconductor layer when an ON voltage is applied to the gate electrode,
   the third semiconductor layer being selectively provided on the first semiconductor layer and being adjacent to the second semiconductor layer,
   the current path includes a part of the second semiconductor layer, the part being provided between the main electrode layer and the third semiconductor layer, and the part being covered by the gate insulating film, and
   a doping density of the third semiconductor layer being higher than a doping density of the first semiconductor layer;
   and further comprising an accumulation channel layer of silicon carbide of the first conductivity type selectively provided between the gate insulating film and the second semiconductor layer and having a lower impurity concentration than the main electrode layer, and
   the current path includes the accumulation channel layer and an inversion channel layer, the accumulation channel layer and the inversion channel layer being connected in series, and the inversion channel layer being formed in a semiconductor of the second conductivity type when the ON voltage is applied to the gate electrode.

2. A semiconductor device according to claim 1, wherein the second semiconductor layer of silicon carbide of the second conductivity type is formed by epitaxial growth.

3. A semiconductor device according to claim 1, wherein the third semiconductor layer is formed by diffusing an impurity of the first conductivity type from a surface of the second semiconductor layer.

4. A semiconductor device according to claim 1, further comprising a second main electrode layer of a second conductivity type provided below the first semiconductor layer, the second main electrode layer having higher impurity concentration than the first semiconductor layer.

5. A semiconductor device according to claim 4, wherein the second main electrode layer of the second conductivity type is a layer formed by an epitaxial growth or by diffusing an impurity of the second conductivity type on a surface of the first semiconductor layer.

6. A semiconductor device comprising:
a first semiconductor layer of silicon carbide of a first conductivity type;
a second semiconductor layer of silicon carbide of a second conductivity type selectively provided on the first semiconductor layer;
a main electrode layer of silicon carbide of the first conductivity type selectively provided on the second semiconductor layer;
a gate insulating film;
a gate electrode adjoining the gate insulating film; and
an accumulation channel layer of silicon carbide of the first conductivity type provided between the second semiconductor layer and the gate insulating film, the accumulation channel layer having a lower impurity concentration than the main electrode layer,
the accumulation channel layer intervening a current path which is formed between the main electrode layer and the first semiconductor layer when an ON voltage is applied to the gate electrode, and
the current path includes the accumulation channel layer and an inversion channel layer, the accumulation channel layer and the inversion channel layer being connected in series, and the inversion channel layer being formed in a semiconductor layer of the second conductivity type when the ON voltage is applied to the gate electrode,
wherein a thickness of the accumulation channel layer is smaller than a thickness of the second semiconductor layer in a stacking direction of stacking the second semiconductor layer and the gate insulating film.

7. A semiconductor device according to claim 6, wherein the semiconductor layer of the second conductivity type is provided in the accumulation channel layer or adjoining the accumulation channel layer between the gate insulating film and the second semiconductor layer.

8. A semiconductor device according to claim 6, further comprising a second main electrode layer of a second conductivity type provided below the first semiconductor layer, the second main electrode layer having higher impurity concentration than the first semiconductor layer.

9. A semiconductor device according to claim 8, wherein the second main electrode layer of the second conductivity type is a layer formed by an epitaxial growth or by diffusing an impurity of the second conductivity type on a surface of the first semiconductor layer.

10. A semiconductor device comprising:
a first semiconductor layer of silicon carbide of a first conductivity type;
a second semiconductor layer of silicon carbide of a second conductivity type selectively provided on the first semiconductor layer;
a main electrode layer of silicon carbide of the first conductivity type selectively provided on the second semiconductor layer;
a gate insulating film;
a gate electrode adjoining the gate insulating film; and
an accumulation channel layer of silicon carbide of the first conductivity type provided between the second semiconductor layer and the gate insulating film, the accumulation channel layer having a lower impurity concentration than the main electrode layer,
the accumulation channel layer intervening a current path which is formed between the main electrode layer and the first semiconductor layer when an ON voltage is applied to the gate electrode, and
the current path includes the accumulation channel layer and an inversion channel layer, the accumulation channel layer and the inversion channel layer being connected in series, and the inversion channel layer being formed in a semiconductor layer of the second conductivity type when the ON voltage is applied to the gate electrode,
wherein the gate insulating film is provided on an inner wall surface of a trench which penetrates the main electrode layer and the second semiconductor layer and reaches the first semiconductor layer, and
the gate electrode is surrounded by the gate insulating film and is packed inside the trench.

11. A semiconductor device comprising:
a first semiconductor layer of silicon carbide of a first conductivity type;
a main electrode layer of silicon carbide of the first conductivity type provided on the first semiconductor layer;
a main electrode provided on the main electrode layer;
a trench penetrating the main electrode layer and extending in the first semiconductor layer;
a gate insulating film provided on an inner wall surface of the trench;
a gate electrode surrounded by the gate insulating film and packed inside the trench;
an accumulation channel layer of silicon carbide of the first conductivity type provided between the gate insulating film and the first semiconductor layer and having a lower impurity concentration than the main electrode layer; and
a fourth semiconductor layer of a second conductivity type provided in the first semiconductor layer, the fourth semiconductor layer being spaced apart from and opposed to the accumulation channel layer, and the fourth semiconductor layer being electrically connected with the main electrode.

12. A semiconductor device according to claim 11, wherein
a current path being formed in the accumulation channel layer when an ON voltage is applied to the gate electrode, and
the accumulation channel layer being depleted when the ON voltage is not applied to the gate electrode.

13. A semiconductor device according to claim 11, further comprising a second main electrode layer of the first conductivity type provided below the first semiconductor layer, the second main electrode layer having higher impurity concentration than the first semiconductor layer.

14. A semiconductor device according to claim 11, further comprising a second main electrode layer of a second conductivity type provided below the first semiconductor layer, the second main electrode layer having higher impurity concentration than the first semiconductor layer.

15. A semiconductor device according to claim 14, wherein the second main electrode layer of the second conductivity type is a layer formed by an epitaxial growth or by diffusing an impurity of the second conductivity type on a surface of the first semiconductor layer.

16. A semiconductor device according to claim 11, wherein a spacing between the accumulation channel layer and the forth semiconductor layer opposing to the accumulation channel layer is not greater than 2 micrometers.

17. A semiconductor device according to claim 1, wherein the semiconductor of the second conductivity type is provided in the accumulation channel layer or adjoining the accumulation channel layer between the gate insulating film and the second semiconductor layer.

18. A semiconductor device according to claim 1, wherein the semiconductor of the second conductivity type is the part of the second semiconductor layer.

19. A semiconductor device according to claim 6, wherein the semiconductor layer of the second conductivity type is the part of the second semiconductor layer, and the part is adjacent to the gate insulating film.

20. A semiconductor device according to claim 6, further comprising a first main electrode adjoining the main electrode layer and a second main electrode electrically connected with the first semiconductor layer.

* * * * *